(12) United States Patent
Akiyama

(10) Patent No.: US 12,199,595 B2
(45) Date of Patent: Jan. 14, 2025

(54) GATE DRIVER

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Hironori Akiyama, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 49 days.

(21) Appl. No.: 18/328,282

(22) Filed: Jun. 2, 2023

(65) Prior Publication Data
US 2024/0007094 A1 Jan. 4, 2024

(30) Foreign Application Priority Data
Jun. 29, 2022 (JP) .................................. 2022-104619

(51) Int. Cl.
H03K 17/08 (2006.01)
H02M 1/08 (2006.01)
H03K 17/16 (2006.01)

(52) U.S. Cl.
CPC .............. H03K 17/08 (2013.01); H02M 1/08 (2013.01); H03K 17/161 (2013.01)

(58) Field of Classification Search
CPC ..................................................... H03K 17/08
USPC ....................................................... 327/109
See application file for complete search history.

(56) References Cited

U.S. PATENT DOCUMENTS

| 6,870,407 | B2 * | 3/2005 | Lundberg | H03K 19/00315 327/333 |
| 8,547,140 | B1 * | 10/2013 | Faucher | H03F 3/2171 326/86 |
| 11,646,665 | B2 * | 5/2023 | Wu | H02M 1/0045 327/109 |
| 2012/0032714 | A1 * | 2/2012 | Shimazaki | H03K 17/04123 327/109 |

(Continued)

FOREIGN PATENT DOCUMENTS

| JP | 2019-154134 A | 9/2019 |
| JP | 2020-113867 A | 7/2020 |

*Primary Examiner* — Tomi Skibinski
(74) *Attorney, Agent, or Firm* — Posz Law Group, PLC

(57) ABSTRACT

A gate driver drives a gate of a semiconductor switching element. The gate driver includes a command signal output circuit, a pre-drive circuit and a drive circuit. The command signal output circuit outputs a current command signal that indicates a command value of a gate current as a current flowing through the gate of the semiconductor switching element. The pre-drive circuit receives the current command signal and generate a drive signal corresponding to the current command signal to output the drive signal. The drive circuit drives the gate of the semiconductor switching element based on the drive signal. The command signal output circuit switches the command value indicated by the current command signal while controlling a transient voltage at a desired target value. The drive circuit includes output circuits connected in parallel. Each of output circuits has at least one cascode circuit in which two MOSFETs are cascode-connected.

14 Claims, 20 Drawing Sheets

(56) References Cited

U.S. PATENT DOCUMENTS

| | | |
|---|---|---|
| 2012/0126858 A1 | 5/2012 | Senda et al. |
| 2015/0349762 A1* | 12/2015 | Kinder .................... H03K 5/13 |
| | | 327/108 |
| 2017/0373676 A1 | 12/2017 | Kaeriyama |
| 2018/0062633 A1 | 3/2018 | Nomura |
| 2020/0021282 A1 | 1/2020 | Yamamoto et al. |
| 2021/0036697 A1 | 2/2021 | Yamamoto et al. |
| 2021/0258004 A1 | 8/2021 | Akiyama et al. |
| 2022/0376689 A1 | 11/2022 | Yamamoto et al. |
| 2022/0407511 A1 | 12/2022 | Akiyama et al. |
| 2022/0416782 A1 | 12/2022 | Akiyama et al. |
| 2023/0021657 A1 | 1/2023 | Akiyama |
| 2023/0114152 A1 | 4/2023 | Akiyama et al. |

* cited by examiner

GATE DRIVER

CROSS REFERENCE TO RELATED APPLICATIONS

This application is based on Japanese Patent Application No. 2022-104619 filed on Jun. 29, 2022, the disclosure of which is incorporated herein by reference.

TECHNICAL FIELD

The present disclosure to a gate driver that drives a gate of a semiconductor switching element.

BACKGROUND

Active Gate Control (AGC) may be adopted as a gate driver for driving a gate of a semiconductor switching element. For the purpose of, for example, loss reduction, noise reduction and element fault prevention, the gate driver with the above structure may adjust a gate current as a current flowing to the gate of the semiconductor switching element in order to control a transient voltage corresponding to the main terminal of the semiconductor switching element during switching to a desired target value. The above-mentioned transient voltage includes a rate of change in the voltage of the main terminal during switching and a peak value of the voltage of the main terminal during switching. The rate of change may also be referred to as dV/dt, and the peak value of the voltage may also be referred to as a surge voltage.

SUMMARY

The present disclosure describes a gate driver that drives a gate of a semiconductor switching element, and further describes that the gate driver includes a pre-drive circuit and a drive circuit.

DETAILED DESCRIPTION

Figure 1:
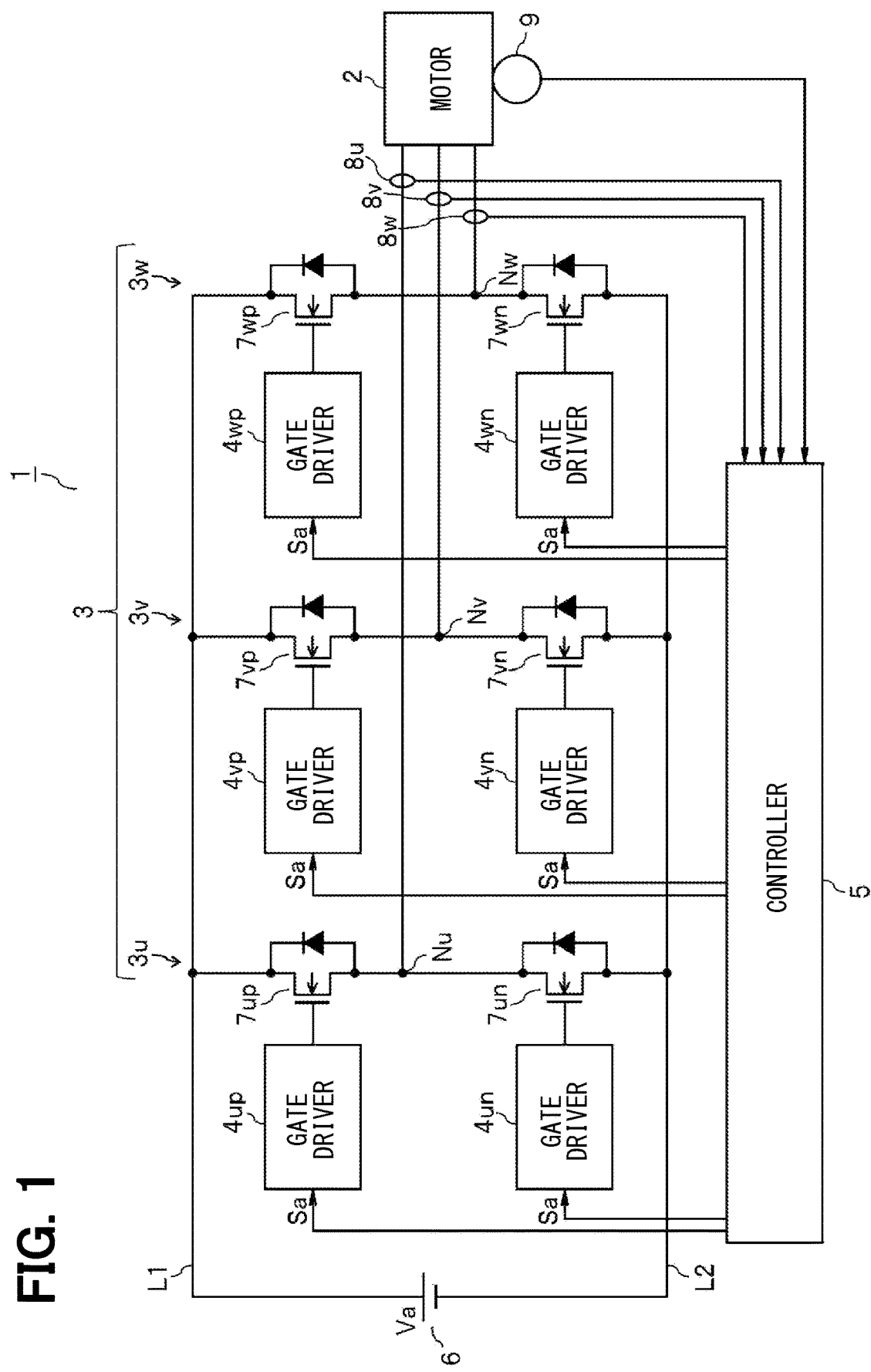
FIG. 1 schematically illustrates a structure of a motor drive apparatus according to a first embodiment.

In a case where the precision of a gate current is relatively low in a gate driver, an error in the control of a transient voltage may increase. Moreover, an excessive surge voltage may be generated that may cause a semiconductor switching element to have a fault. Therefore, it may be desired to control the gate current to a desired value with higher precision in the gate driver with the above structure. Additionally, the semiconductor switching element such as Silicon Carbide (SiC) MOSFET capable of high-speed switching may be adopted as a target driven by the gate driver. Thus, it may be desirable to change the gate current at a higher speed in the gate driver with the above structure.

In a first comparative example, a constant current gate driver controls a gate current of an insulated gate bipolar transistor (IGBT) by adopting an operational amplifier to execute feedback control of the current flowing through a shunt resistor in a path where the gate current flows. In this situation, the operational amplifier is controlled based on a control signal that indicates a command value of the gate current. In a second comparative example, a digital gate driver for controlling a gate current of the IGBT includes multiple drive circuits connected in parallel, and change the number of drive circuit(s) to be turned on according to an elapsed time.

In the first comparative example, although the gate current may be controlled with higher precision, the high-speed switching of the gate current may not be executed because of the delay of the feedback loop through the operational amplifier. In other words, in the first comparative example, it may be difficult to enhance a change of the actual gate current in response to a change in the command value of the gate current, in other words, a change in the responsiveness of the control of the gate current. In the first comparative example, since it may be required to provide the operational amplifier, the circuitry size in the first comparative example may be enlarged accordingly.

In a second comparative example, since it is possible to change the gate current by switching on and off the MOSFET included in a drive circuit, it is possible to operate the gate current at a higher speed. In other words, it is possible to enhance the responsiveness of the control of the gate current in the second comparative example. However, in the second comparative example, due to the influence of channel length modulation of the MOSFET included in the drive circuit, even though the number of the drive circuits to be turned on is identical, the gate current may vary according to a change in the voltage between the gate and emitter of the IGBT. As a result, it may be difficult to enhance the precision of the gate current.

According to an aspect of the present disclosure, a gate driver drives a gate of a semiconductor switching element. The gate driver includes a command signal output circuit, a pre-drive circuit and a drive circuit. The command signal output circuit outputs a current command signal that indicates a command value of a gate current as a current flowing through the gate of the semiconductor switching element. The pre-drive circuit receives the current command signal and generate a drive signal corresponding to the current command signal to output the drive signal. The drive circuit drives the gate of the semiconductor switching element based on the drive signal.

The command signal output circuit switches the command value indicated by the current command signal while controlling a transient voltage at a desired target value. The transient voltage corresponds to a voltage of a main terminal of the semiconductor switching element at a time of switching the semiconductor switching element. The drive circuit includes output circuits connected in parallel. The output circuits have MOSFETs and cascode circuits. Each of output circuits has one or more of the cascode circuits. Each of cascode circuits has two of the MOSFETs that are cascode-connected. The drive circuit turns on at least one of the MOSFETs to enable flow of the gate current to drive the gate of the semiconductor switching element. Therefore, it is possible that the drive circuit with the above structure changes the gate current by changing the number of the MOSFETs to be turned on according to the command value indicated by the drive signal.

According to the above structure, the delay from a time where the command value of the gate current changes to a time where the gate current actually changes is mainly caused by only the propagation delay in the MOSFETs of the output circuits. Therefore, it is possible to switch the gate current at a higher speed. In other words, it is possible to enhance the responsiveness in the control of the gate current. Moreover, the circuitry size in the above structure does not increase as compared with the first comparative example, since the above structure does not require an operational amplifier.

According to the above structure, the output circuit includes the cascode circuit in which two MOSFETs are cascode-connected. The following describes the advantageous effects brought by the cascode circuit. The following describes one of the two MOSFETs on the common source side as a first transistor, and describes the other one of the two MOSFETs being different from the above-mentioned MOSFET on the common source side as a second transistor.

According to the above structure, since a change in the voltage between the gate and source of the semiconductor switching element or the voltage between the gate and emitter of the semiconductor switching element is absorbed by the voltage between the drain and source on the second transistor side, the voltage between the drain and source of the MOSFET on the first transistor side is kept substantially constant. In this situation, the value of the gate current is determined mainly according to the first transistor. According to the above structure, since a change in the gate current along with a change in the voltage between the gate and source of the semiconductor switching element or the voltage between the gate and emitter of the semiconductor switching element is suppressed, it is possible to enhance the precision of the gate current. According to the structure, it is possible to change the gate current with higher precision and without enlarging the circuitry size, while enhancing the responsiveness in the control of the gate current.

The following will describe embodiments of the present disclosure with reference to the accompanying drawings. Hereinafter, in the respective embodiments, substantially the same structures are denoted by identical symbols, and repetitive description will be omitted.

First Embodiment

The following describes a first embodiment with reference to FIGS. 1 to 19.

(Structure of Motor Drive Apparatus)

As illustrated in FIG. 1, a motor drive apparatus 1 according to the present embodiment drives a motor 2 adapted to a vehicle such as an automobile, and includes, for example, an inverter 3, gate drivers 4*up* to 4*wn* and a controller 5. The inverter 3 converts a direct current (DC) power supply voltage Va to a three-phase alternating current (AC) voltage of U-phase, V-phase, and W-phase and output the converted three-phase AC voltage. The DC power supply voltage Va is supplied through a pair of DC power supply lines L1, L2 from a DC power supply 6 as a battery adapted to, for example, a vehicle. The three-phase output of the inverter 3 is provided to the motor 2 in order to drive the motor 2. In this situation, the power supply voltage Va is a relatively high voltage such as several hundred volts since the power supply voltage Va is assumed to be applied in a vehicle.

The inverter 3 includes three half-bridge circuits 3*u*, 3*v*, and 3*w* respectively connected between DC power supply lines L1 and L2. The half-bridge circuit 3*u* includes a semiconductor switching element 7*up* as an upper arm and a semiconductor switching element 7*un* as a lower arm. The half-bridge circuit 3*v* includes a semiconductor switching element 7*vp* as an upper arm and a semiconductor switching element 7*vn* as a lower arm. The half-bridge circuit 3*w* includes a semiconductor switching element 7*wp* as an upper arm and a semiconductor switching element 7*wn* as a lower arm.

The switching elements 7*up* to 7*wn* are power devices such as SiC-MOSFET. Each of the switching elements 7*up* to 7*wn* includes an N-channel type MOSFET and a reflux diode connected between the drain and source of the MOSFET. The anode of the reflux diode is connected at the source side of the MOSFET. In other words, the reflux diode is connected in antiparallel to the MOSFET. In this situation, the reflux diode is provided as an element separated from the MOSFET. However, the reflux diode may be adopted as a body diode of the MOSFET.

The drains of the respective semiconductor switching elements 7*up*, 7*vp*, 7*wp* are connected to the DC power supply line L1 as a high-potential side. The sources of the respective semiconductor switching elements 7*up*, 7*vp*, 7*wp* are connected to the corresponding drains of the semiconductor switching elements 7*un*, 7*vn*, 7*wn*. The sources of the respective semiconductor switching elements 7*up*, 7*vp*, 7*wp* are connected to the DC power supply line L2 as a low-potential side.

A node Nu as a common connection node between the semiconductor switching elements 7*up* and 7*un* functions as an output terminal of the U-phase of the inverter 3, and is connected to the motor 2. A node Nv as a common connection node between the semiconductor switching elements 7*vp* and 7*vn* functions as an output terminal of the V-phase of the inverter 3, and is connected to the motor 2. A node Nw as a common connection node between the semiconductor switching elements 7*wp* and 7*wn* functions as an output terminal of the W-phase of the inverter 3, and is connected to the motor 2.

The gate driver 4*up* drives the gate of the semiconductor switching element 7*up* as the upper arm of the half-bridge circuit 3*u*. The gate driver 4*un* drives the gate of the semiconductor switching element 7*un* as the lower arm of the half-bridge circuit 3*u*. The gate driver 4*vp* drives the gate of the semiconductor switching element 7*vp* as the upper arm of the half-bridge circuit 3*v*. The gate driver 4*vn* drives the gate of the semiconductor switching element 7*vn* as the lower arm of the half-bridge circuit 3*v*. The gate driver 4*wp* drives the gate of the semiconductor switching element 7*wp* as the upper arm of the half-bridge circuit 3*w*. The gate driver 4*wn* drives the gate of the semiconductor switching element 7*wn* as the lower arm of the half-bridge circuit 3*w*.

The gate drivers 4*up* to 4*wn* have common structures, and the semiconductor switching elements 7*up* to 7*wn* have common structures. In the following, the gate drivers 4*up* to 4*wn* may be collectively referred to as a gate driver 4, and the semiconductor switching elements 7*up* to 7*wn* may be collectively referred to as a semiconductor switching element 7. The controller 5 includes, for example, a microcomputer, and controls the drive of the motor 2 by controlling the operation of each of the half-bridge circuits 3*u* to 3*w* in the inverter 3.

The controller 5 receives the three-phase output current of the inverter 3 detected by the current sensors 8*u*, 8*v*, 8*w* and a detection signal indicating the rotational angle of the motor 2 detected by a resolver 9. The three-phase output current corresponds to a detection signal indicating the detection value of the three-phase current flowing through the motor 2. The controller 5 generates a command signal Sa for commanding the operations of the respective gate drivers 4*up* to 4*wn* based on the detection signals, such that the current flowing through the motor 2 matches a desired target current and the rotational angle of the motor 2 matches a desired target rotational angle.

The gate driver 4 executes Pulse Width Modulation (PWM) control for driving the semiconductor switching element based on the command signal Sa provided from the controller 5. The command signal Sa is a binary signal. For example, the command signal Sa indicates a turn-on command of the semiconductor switching element 7 when the command signal Sa is at a high level, and the command signal Sa indicates a turn-off command of the semiconductor switching element 7 when the command signal Sa is at a low level. In this situation, the semiconductor switching element 7 forming the upper arm and the semiconductor switching element 7 forming the lower arm are complementarily turned on and off. Therefore, the semiconductor switching element 7 forming the lower arm is turned off when the semiconductor switching element 7 forming the upper arm is turned on, and the semiconductor switching element 7 forming the upper arm is turned off when the semiconductor switching element 7 forming the lower arm is turned on.

In the above structure, the voltage Vds between the drain and source of the semiconductor switching element 7 corresponds to a voltage of the main terminal of the semiconductor switching element 7. In the above structure, the drain current Id corresponds to a current flowing through the main terminal of the semiconductor switching element 7. In the following, the drain current Id is simply referred to as a current Id, and the voltage Vds between the drain and source is simply referred to as a voltage Vds.

Figure 2:
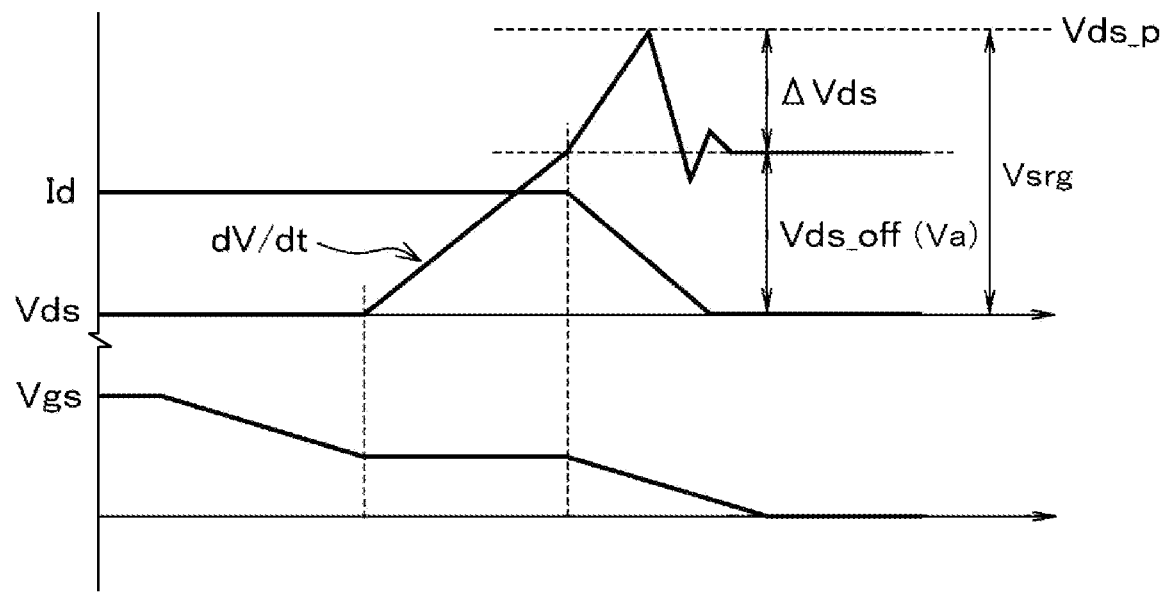
FIG. 2 schematically illustrates respective waveforms of parts when a semiconductor switching element according to the first embodiment is turned off.

When the semiconductor switching element 7 is switched, the respective waveforms of parts during the turn-off of the semiconductor switching element 7 are illustrated in FIG. 2. FIG. 2 illustrates the respective waveforms of the parts corresponding to the semiconductor switching element 7 forming the lower arm. However, the above may also be applied to the semiconductor switching element 7 forming the upper arm. A turn-off voltage Vds_off during which the semiconductor switching element 7 is at a level substantially identical to the power supply voltage Va.

The peak value Vds_p of the voltage Vds at the time of turn-off corresponds to a peak value of the voltage of the main terminal at the time of switching the semiconductor switching element 7. The peak value Vds_p is acquired by adding the voltage ΔVds to the turn-off voltage Vds_off, and is identical to a surge voltage superimposed on the semiconductor switching element 7. In the following, the peak value Vds_p is also referred to as a surge voltage Vsrg. The rate of a change, in other words, the slew rate of the voltage Vds at the time of turn-off corresponds to a rate of change in a voltage of the main terminal at the time of switching the semiconductor switching element 7. In the following, a rate of change in the voltage Vds is also referred to as a rate of change dV/dt.

Each of the surge voltage Vsrg and the rate of change dV/dt corresponds to a transient voltage. The transient voltage corresponds to a voltage of the main terminal of the semiconductor switching element 7 at the time of switching the semiconductor switching element 7. The gate driver 4 according to the present embodiment has a variety of functions so that such a transient voltage can be controlled to a desired target value.

(Functions of Gate Driver)

Figure 3:
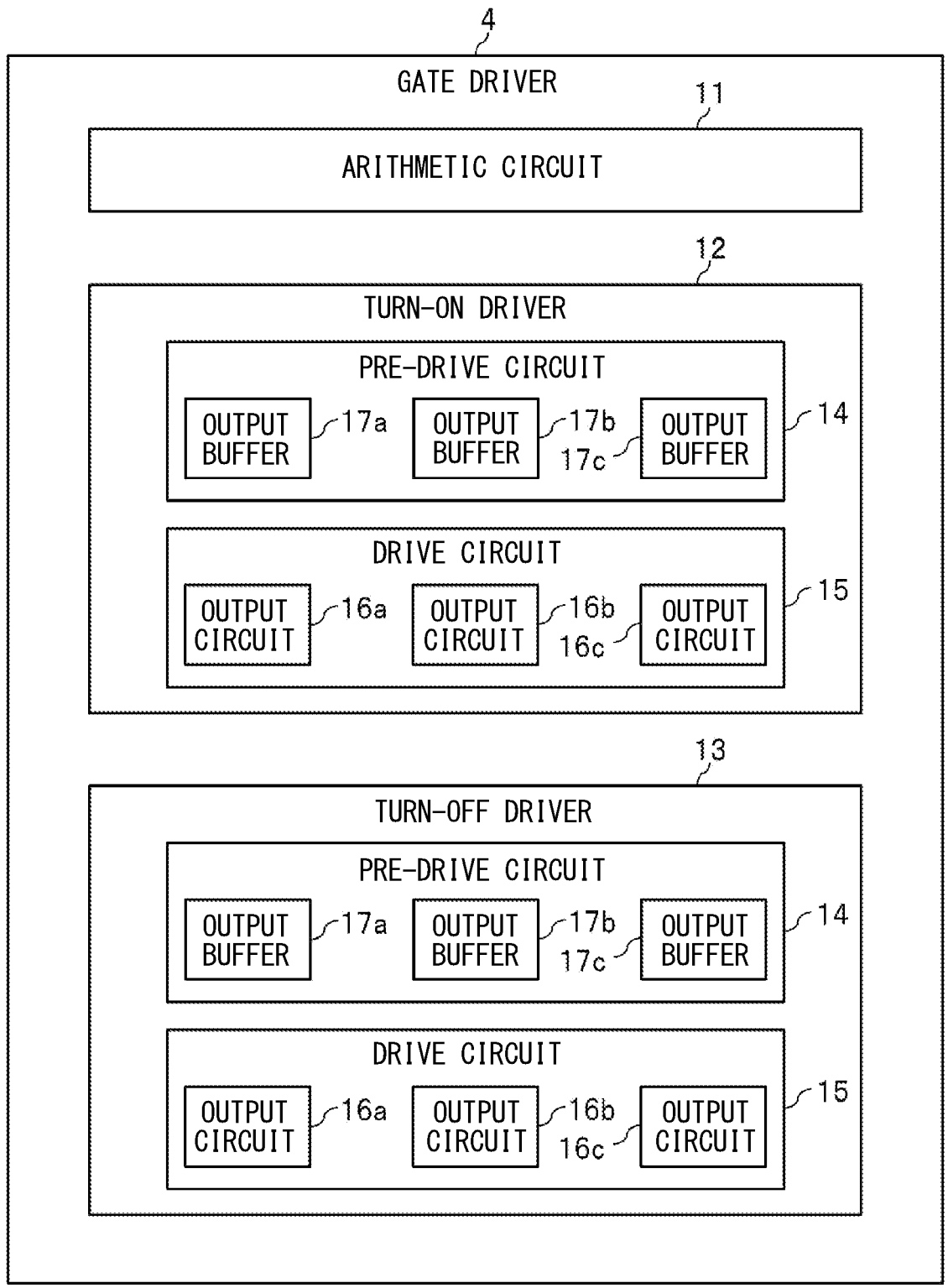
FIG. 3 schematically illustrates a main function of a gate driver according to the first embodiment.

The following describes several main functions of the gate driver 4 with reference to FIG. 3. In FIG. 3 or the like, the main functions of the gate driver 4 are illustrated as functional blocks. The implementation of each function is described in the following. As illustrated in FIG. 3, the gate driver 4 includes an arithmetic circuit 11, a turn-on driver 12 and a turn-off driver 13. The arithmetic circuit 11 outputs a current command signal that indicates a command value of the gate current Ig as a current flowing through the gate of the semiconductor switching element 7, and functions as a command signal output circuit.

The turn-on driver 12 is a structure for turning on the semiconductor switching element 7, and the turn-off driver 13 is a structure for turning off the semiconductor switching element 7. The turn-on driver 12 and the turn-off driver 13 have substantially common structures except the difference between a turn-on operation and a turn-off operation. Since the turn-on driver 12 and the turn-off driver 13 have substantially identical structures and operations, the following describes the turn-off driver 13 and omits the description of the turn-on driver 12.

The turn-off driver 13 includes a pre-drive circuit 14 and a drive circuit 15. The pre-drive circuit 14 receives the current command signal output from the arithmetic circuit 11, and generates and outputs a drive signal corresponding to the current command signal. The drive circuit 15 drives the gate of the semiconductor switching element 7 based on the drive signal output from the pre-drive circuit 14. The arithmetic circuit 11 switches the command value indicated by the current command signal to control the above-mentioned transient voltage to a desired target value.

The drive circuit 15 has a structure in which three output circuits 16a, 16b, 16c are connected in parallel. Each of the output circuits 16a, 16b, 16c includes a structure having a cascode circuit in which two MOSFETs are cascode-connected. In other words, the two MOSFETs are connected in a cascode form. By turning on the MOSFETs in the output circuits 16a, 16b, 16c, the gate current Ig flows to drive the gate of the semiconductor switching element 7. The drive circuit 15 can change the gate current Ig by changing the number of MOSFETs to be turned on, according to a command value indicated by the drive signal output from the pre-drive circuit 14, in other words, the command value indicated by the current command signal output from the arithmetic circuit 11.

The pre-drive circuit 14 includes three output buffers 17a, 17b, 17c respectively provided for the three output circuits 16a, 16b, 16c of the drive circuit 15. In this situation, the three output circuits 16a, 16b, 16c of the drive circuit 15 are constructed to have different current capacities. In this situation, the three output buffers 17a, 17b, 17c respectively have buffer capacities corresponding to the current capacities of the output circuits 16a, 16b, 16c. The term "capacity" descried in the present disclosure may also be referred to as a term "capability".

The pre-drive circuit 14 generates a drive signal and then outputs the drive signal, such that a first delay time is longer than a second delay time. The first delay time is a time required for the MOSFETs in the output circuits 16a to 16c of the drive circuit 15 to switch from an off-state to an on-state. The second delay time is a time required for the MOSFETs in the output circuits 16a to 16c of the drive circuit 15.

(Structure of Gate Driver)

Figure 4:
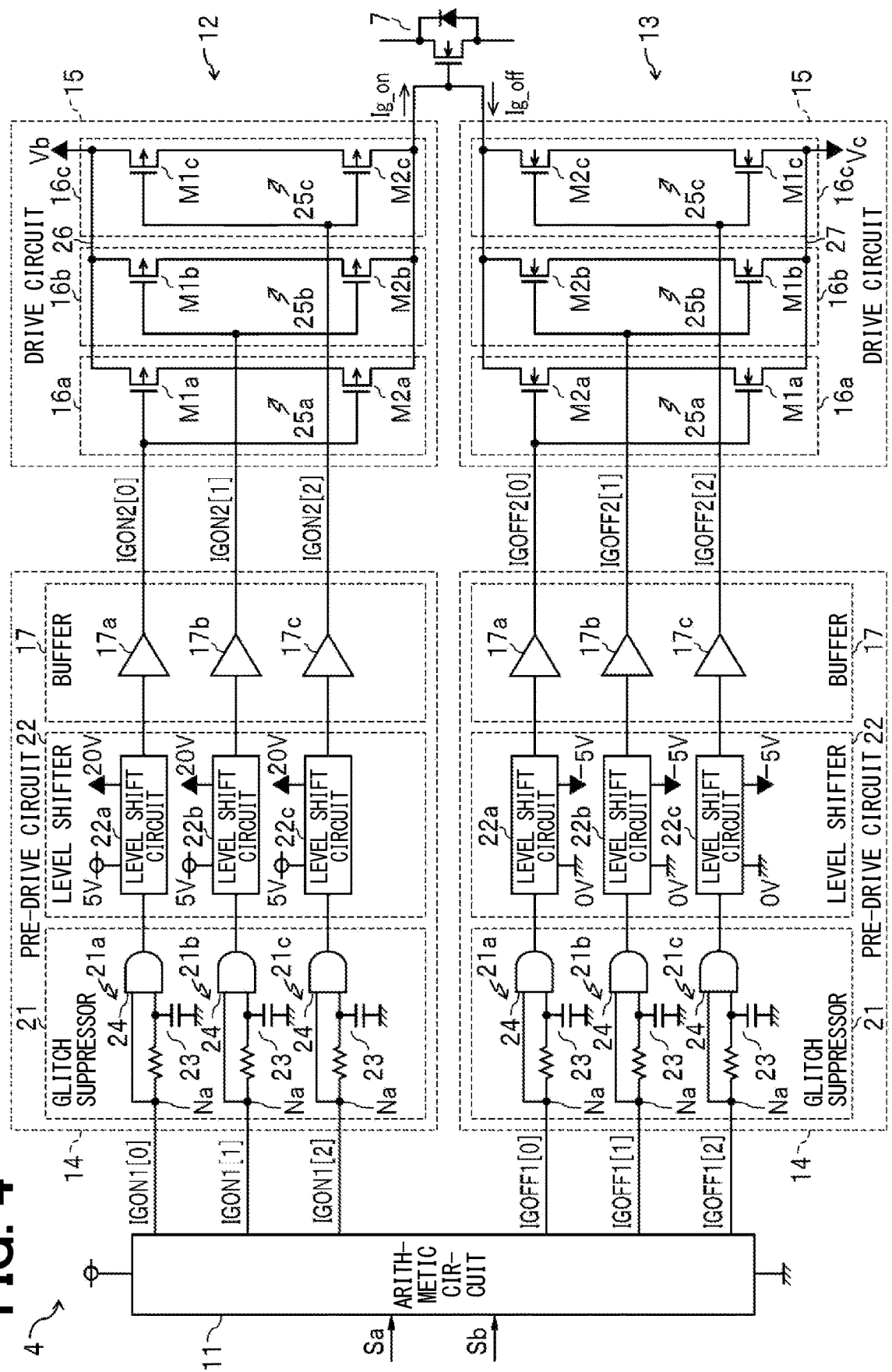
FIG. 4 illustrates an example of the structure of the gate driver according to the first embodiment.

The following describes an example of a structure of the gate driver 4 with reference to FIG. 4. In this situation, the gate driver 4 is a semiconductor integrated circuit (IC). As illustrated in FIG. 4, the arithmetic circuit 11 receives a signal Sb indicating element relevant information as information related to the semiconductor switching element 7. The element relevant information includes at least one of the current Id, the power supply voltage Va, the surge voltage Vsrg, the temperature of the semiconductor switching element 7, the temperature of the gate driver 4 and the rate of change dV/dt. The arithmetic circuit 11 computes the command value of the gate current Ig based on the element relevant information indicated by the signal Sb.

A command signal Sa output from the controller 5 is provided to the arithmetic circuit 11. When the arithmetic circuit 11 receives the command signal Sa indicating the turn-on command, the current command signal related to turn-on is output to the turn-on driver 12. In other words, at the timing during which the semiconductor switching element 7 is turned on, the current command signal related to turn-on is output to the turn-on driver 12. The current command signal related to the turn-on indicates a command value of the gate current Ig_on as the gate current Ig for turning on the gate of the semiconductor switching element 7. The current command signal includes multiple turn-on command signals having, for example, IGON1[0], IGON1[1] and IGON1[2].

In other words, the current command signal related to the turn-on includes 3-bit turn-on command signal IGON1[2:0]. The 3-bit turn-on command signal IGON1[2:0] corresponds to the three output circuits 16a to 16c included in the drive circuit 15 of the turn-on driver 12. Each of the three turn-on command signals included in IGON1[2:0] is a binary signal having a first level and a second level. The first level commands the MOSFETs in the corresponding output circuits 16a to 16c to be turned on. The second level commands the MOSFETs in the corresponding output circuits 16a to 16c to be turned off. In the present embodiment, with regard to the turn-on command signal IGON1[2:0], the first level is a relatively low level such as 0 volt(V), and the second level is a relatively high level such as 5 V.

When the arithmetic circuit 11 receives the command signal Sa indicating the turn-off command, the current command signal related to turn-off is output to the turn-off driver 13. In other words, at the timing during which the semiconductor switching element 7 is turned off, the current command signal related to turn-off is output to the turn-off driver 13. The current command signal related to the turn-off indicates a command value of the gate current Ig_off as the gate current Ig for turning off the gate of the semiconductor switching element 7. The current command signal includes multiple turn-off command signals having, for example, IGOFF1[0], IGOFF1[1] and IGOFF1[2].

In other words, the current command signal related to the turn-off includes 3-bit turn-off command signal IGOFF1[2:0]. The 3-bit turn-off command signal IGOFF1[2:0] corresponds to the three output circuits 16a to 16c included in the drive circuit 15 of the turn-off driver 13. Each of the three turn-off command signals included in IGOFF1[2:0] is a binary signal having a first level and a second level. The first level commands the MOSFETs in the corresponding output circuits 16a to 16c to be turned on. The second level commands the MOSFETs in the corresponding output circuits 16a to 16c to be turned off. In the present embodiment, with regard to the turn-off command signal IGOFF1[2:0], the first level is a relatively high level such as 5 V, and the second level is a relatively low level such as 0 V.

Each of the current command signal related to the turn-on and the current command signal related to the turn-off indicates a command value of the gate current Ig having at least two levels. The arithmetic circuit 11 switches the command value in two or more levels indicated by each of the current command signal related to the turn-on and the current command signal related to the turn-off to control the above-mentioned transient voltage to a desired target value. The current command signal related to the turn-on output from the arithmetic circuit 11 is provided to the pre-drive circuit 14 of the turn-on driver 12. The current command signal related to the turn-off output from the arithmetic circuit 11 is provided to the pre-drive circuit 14 of the turn-off driver 13.

The pre-drive circuit 14 of the turn-on driver 12 receives the turn-on command signal IGON1[2:0], and generates the drive signal related to the turn-on corresponding to the turn-on command signal IGON1[2:0] and output the drive signal. The drive signal related to the turn-on includes multiple binary turn-on drive signals having, for example, three turn-on drive signals IGON2[0], IGON2[1], IGON2[2]. In other words, the current drive signal related to the turn-on includes 3-bit turn-on drive signal IGON2[2:0]. In the present embodiment, with regard to the turn-on drive signal IGON2[2:0], the first level is a relatively low level such as 15 V, and the second level is a relatively high level such as 20 V.

The pre-drive circuit 14 of the turn-off driver 13 receives the turn-off command signal IGOFF1[2:0], and generates the drive signal related to the turn-off corresponding to the turn-off command signal IGOFF1[2:0] and output the drive signal. The drive signal related to the turn-off includes multiple binary turn-off drive signals having, for example, three turn-off drive signals IGOFF2[0], IGOFF2[1], IGOFF2[2]. In other words, the drive signal related to the turn-off includes 3-bit turn-off drive signals IGOFF2[2:0]. In the present embodiment, with regard to the turn-off command signal IGOFF2[2:0], the first level is a relatively high level such as 0 V, and the second level is a relatively low level such as −5 V.

The pre-drive circuit 14 includes a glitch suppressor 21, a level shifter 22 and a buffer 17. The glitch suppressor 21 outputs a signal that delays a turn-on command edge to be later than the turn-off command edge by a predetermined time to each of the turn-off command signals included in IGOFF1[2:0]. The turn-on command edge is an edge switched from the second level to the first level, and the turn-off command edge is an edge switched from the first level to the second level. The glitch suppressor 21 includes three glitch suppression circuits 21a, 21b, 21c.

The glitch suppression circuit 21a receives the turn-off command signal IGOFF1[0]. The glitch suppression circuit 21a outputs a signal that sets the turn-on instruction edge to be later than the turn-off command edge by only a predetermined time to the turn-off instruction signal IGOFF1[0]. The glitch suppression circuit 21b receives the turn-off command signal IGOFF1[1]. The glitch suppression circuit 21b outputs a signal that sets the turn-on instruction edge to be later than the turn-off command edge by only a predetermined time to the turn-off instruction signal IGOFF1[1]. The glitch suppression circuit 21c receives the turn-off command signal IGOFF1[2]. The glitch suppression circuit 21c outputs a signal that sets the turn-on instruction edge to be later than the turn-off command edge by only a predetermined time to the turn-off instruction signal IGOFF1[2].

Each of the glitch suppression circuits 21a to 21c includes an RC filter 23 and an AND circuit 24. The RC filter 23 includes a resistor and a capacitor. A terminal of the resistor is connected to a node Na as an input terminal of each of the glitch suppression circuits 21a to 21c, and another terminal of the resistor is connected to a ground as a reference potential of the circuit through the capacitor. An input terminal of the AND circuit 24 is connected to the node Na, and another input terminal of the common connection node between the resistor and the capacitor. The output terminal of the AND circuit 24 functions as the output terminal of each of the glitch suppression circuits 21a to 21c.

The glitch suppression circuits 21a to 21c with the above structure output signals acquired by delaying both of the turn-on command edge and the turn-off command edge to the input turn-off command signal IGOFF1[2:0]. In other words, the glitch suppression circuits 21a to 21c can output the signal that provide a delay time to both of the turn-on command edge and the turn-off command edge. In the signal output from each of the glitch suppression circuits 21a to 21c, the delay time provided to the turn-on command edge corresponds to a first delay time, and the delay time provided to the turn-off command edge corresponds to a second delay time. In the signal output from each of the glitch suppression circuits 21a to 21c, the first delay time provided to the turn-on command edge is longer than the second delay time provided to the turn-off command edge.

The level shifter 22 outputs a signal acquired by shifting the level of the signal output from each of the glitch suppression circuits 21a to 21c. The level shifter 22 includes three level shift circuits 22a, 22b, 22c. The level shift circuit 22a receives the output signal of the glitch suppression circuit 21a, in other words, a signal acquired by adding a delay time to the turn-off command signal IGOFF1[0]. The level shift circuit 22a outputs a signal acquired by shifting such an input signal.

The level shift circuit 22b receives the output signal of the glitch suppression circuit 21b, in other words, a signal acquired by adding a delay time to the turn-off command signal IGOFF1[1]. The level shift circuit 22b outputs a signal acquired by shifting the level of such an input signal. The level shift circuit 22c receives the output signal of the glitch suppression circuit 21c, in other words, a signal acquired by adding a delay time to the turn-off command signal IGOFF1[2]. The level shift circuit 22c outputs a signal acquired by shifting the level of such an input signal.

Each of the level shift circuits 22a to 22c provided in the pre-drive circuit 14 of the turn-on driver 12 outputs a signal acquired by shifting the input signal changed between two values 0 V and 5 V to a signal changed between two values 15 V and 20 V. Each of the level shift circuits 22a to 22c provided in the pre-drive circuit 14 of the turn-off driver 13 outputs a signal acquired by shifting the input signal changed between two values 0 V and 5 V to a signal changed between two values −5 V and 0 V.

The following describes the reason why such a level shifter 22 is provided in the pre-drive circuit 14. For example, when the semiconductor switching element 7 is the SiC-MOSFET, a voltage about, for example, 20 V as the gate drive voltage during the turn-on is recommended for suppressing the on-resistance, and a voltage about, for example, −5 V as the gate drive voltage during the turn-off is recommended for preventing the semiconductor switching element 7 from being turned on erroneously. On the other hand, in an IC process adopted in constructing the gate driver 4 as the IC, the breakdown voltage between the gate and source of the MOSFET is generally, for example, 5 V and 3.3 V.

For driving the gate of the semiconductor switching element 7 as the SiC-MOSFET, when 20 V and −5 V are provided as push-pull output for the gate driver 4 constructed as the IC, a voltage about at least 25 V is required as the breakdown voltage of the gate of the output transistor, in other words, the MOSFET in the drive circuit 15. In consideration of a transient change in a voltage, a margin of 10 V or more is required for the breakdown voltage of the gate. In the present embodiment, the breakdown voltage of the gate of the MOSFET in the drive circuit 15 is set to a voltage about 5 V in the IC process, and the level shifter 22 is provided in the pre-drive circuit 14 for attaining the above-described voltage as the gate drive voltage during turn-on and turn-off of the semiconductor switching element 7.

The buffer 17 includes three output buffers 17a, 17b, 17c. The output buffer 17a receives the output signal of the level shift circuit 22a, and outputs a signal corresponding to the received output signal to the output circuit 16a of the drive circuit 15. The output buffer 17b receives the output signal of the level shift circuit 22b, and outputs a signal corresponding to the received output signal to the output circuit 16b of the drive circuit 15. The output buffer 17c receives the output signal of the level shift circuit 22c, and outputs a signal corresponding to the received output signal to the output circuit 16c of the drive circuit 15.

The respective output signals of the output buffers 17a to 17c in the pre-drive circuit 14 of the turn-on driver 12 are turn-on drive signals IGON2[0], IGON2[1], and IGON2[2]. The respective output signals of the output buffers 17a to 17c in the pre-drive circuit 14 of the turn-off driver 13 are turn-off drive signals IGOFF2[0], IGOFF2[1], and IGOFF2[2].

In this situation, the output buffers 17a, 17b, 17c respectively have buffer capacities, in other words, the output capacities corresponding to the current capacities of the output circuits 16a, 16b, 16c. The buffer capacities of such output buffers 17a to 17c are respectively determined by the sizes of the output buffers 17a to 17c, in particular, the sizes of the transistors respectively inside the output buffers 17a to 17c.

The drive circuit 15 drives the gate of the semiconductor switching element 7 with a constant current. As described above, the drive circuit 15 includes the three output circuits 16a, 16b, 16c connected in parallel. The output circuit 16a incudes one cascode circuit 25a in which two MOSFETs M1a, M2a are cascode-connected. The gates of the respective MOSFETs M1a, M2a are commonly connected.

The output circuit 16b includes one cascode circuit 25b in which two MOSFETs M1b, M2b are cascode-connected. The gates of the respective MOSFETs M1b, M2b are commonly connected. The output circuit 16c includes one cascode circuit 25c in which two MOSFETs M1c, M2c are cascode-connected. The gates of the respective MOSFETs M1c, M2c are commonly connected.

Each of the MOSFETs M1a to M2c of the turn-on driver 12 is a P-channel type MOSFET. The turn-on drive signal IGON2[0] output from the pre-drive circuit 14 is provided to the commonly connected gates of the MOSFETs M1a, M2a. The turn-on drive signal IGON2[1] output from the pre-drive circuit 14 is provided to the commonly connected gates of the MOSFETs M1b, M2b. The turn-on drive signal IGON2[2] output from the pre-drive circuit 14 is provided to the commonly connected gates of the MOSFETs M1c, M2c.

The sources of the MOSFETs M1a, M1b, M1c of the turn-on driver 12 are commonly connected, and are connected to a power supply line 26 supplied with the voltage Vb. The drains of the MOSFETs M1a, M1b, M1c are respectively connected to the sources of the MOSFETs M2a, M2b, M2c of the turn-on driver 12. The drains of the MOSFETs M2a, M2b, M2c of the turn-on driver 12 are commonly connected, and are connected to the gate of the semiconductor switching element 7. The voltage Vb is a voltage based on the source potential of the semiconductor switching element 7, and is sufficiently higher than a gate threshold voltage of the semiconductor switching element 7. In the present embodiment, the voltage Vb is, for example, 20 V.

According to the above structure, the MOSFETs M1a to M2c included in the output circuits 16a to 16c of the turn-on driver 12 are turned on and off according to the respective levels of the turn-on drive signals included in IGON2[2:0]. In other words, the MOSFETs M1a, M2a of the output circuit 16a are turned on when the turn-on drive signal IGON2[0] is at the low level, and are turned off when the turn-on drive signal IGON2[0] is at the high level. In other words, the output circuit 16a is turned on when the turn-on drive signal IGON2[0] is at the low level, and is turned off when the turn-on drive signal IGON2[0] is at the high level.

The MOSFETs M1b, M2b of the output circuit 16b are turned on when the turn-on drive signal IGON2[1] is at the low level, and are turned off when the turn-on drive signal IGON2[1] is at the high level. In other words, the output circuit 16b is turned on when the turn-on drive signal IGON2[1] is at the low level, and is turned off when the turn-on drive signal IGON2[1] is at the high level. The MOSFETs M1c, M2c of the output circuit 16c are turned on when the turn-on drive signal IGON2[2] is at the low level, and are turned off when the turn-on drive signal IGON2[2] is at the high level. In other words, the output circuit 16c is turned on when the turn-on drive signal IGON2[2] is at the low level, and is turned off when the turn-on drive signal IGON2[2] is at the high level.

Each of the MOSFETs M1a to M2c of the turn-off driver 13 is an N-channel type MOSFET. The turn-off drive signal IGOFF2[0] output from the pre-drive circuit 14 is provided to the commonly connected gates of the MOSFETs M1a, M2a. The turn-off drive signal IGOFF2[1] output from the pre-drive circuit 14 is provided to the commonly connected gates of the MOSFETs M1b, M2b. The turn-off drive signal IGOFF2[2] output from the pre-drive circuit 14 is provided to the commonly connected gates of the MOSFETs M1c, M2c.

The sources of the MOSFETs M1a, M1b, M1c of the turn-off driver 13 are commonly connected, and are connected to a power supply line 27 supplied with the voltage Vc. The drains of the MOSFETs M1a, M1b, M1c are respectively connected to the sources of the MOSFETs M2a, M2b, M2c of the turn-off driver 13. The drains of the MOSFETs M2a, M2b, M2c of the turn-off driver 13 are commonly connected, and are connected to the gate of the semiconductor switching element 7. The voltage Vc is equal to a source potential of the semiconductor switching element 7 or lower than the source potential. In the present embodiment, the voltage Vc is, for example, −5 V.

According to the above structure, the MOSFETs M1a to M2c included in the output circuits 16a to 16c of the turn-off driver 13 are turned on and off according to the respective levels of the turn-off drive signals included in IGOFF2[2:0]. In other words, the MOSFETs M1a, M2a of the output circuit 16a are turned on when the turn-off drive signal IGOFF2[0] is at the high level, and are turned off when the turn-off drive signal IGOFF2[0] is at the low level. In other words, the output circuit 16a is turned on when the turn-off drive signal IGOFF2[0] is at the high level, and is turned off when the turn-off drive signal IGOFF2[0] is at the low level.

In addition, the MOSFETs M1b, M2b of the output circuit 16b are turned on when the turn-off drive signal IGOFF2[1] is at the high level, and are turned off when the turn-off drive signal IGOFF2[1] is at the low level. In other words, the output circuit 16b is turned on when the turn-off drive signal IGOFF2[1] is at the high level, and is turned off when the turn-off drive signal IGOFF2[1] is at the low level.

Moreover, the MOSFETs M1c, M2c of the output circuit 16c are turned on when the turn-off drive signal IGOFF2[2] is at the high level, and are turned off when the turn-off drive signal IGOFF2[2] is at the low level. In other words, the output circuit 16c is turned on when the turn-off drive signal IGOFF2[2] is at the high level, and is turned off when the turn-off drive signal IGOFF2[2] is at the low level.

According to the above structure, the gate current IG_on flows to turn on the semiconductor switching element 7, when at least one of the output circuits 16a, 16b, 16c of the turn-on driver 12 is turned on. In this situation, by saturating the MOSFETs M1a to M2c, it is possible to operate the MOSFETs M1a to M2c with a constant power current supply so that the gate current Ig_on can be kept constant. In the above structure, it is possible to change the value of the gate current Ig_on according to the number of the output circuits 16a, 16b, 16c to be turned on.

According to the above structure, the gate current IG_off flows to turn off the semiconductor switching element 7, when at least one of the output circuits 16a, 16b, 16c of the turn-off driver 13 is turned off. In this situation, by saturating the MOSFETs M1a to M2c, it is possible to operate the MOSFETs M1a to M2c with a constant power current supply so that the gate current Ig_off can be kept constant. In the above structure, it is possible to change the value of the gate current Ig_off according to the number of the output circuits 16a, 16b, 16c to be turned on.

The output circuits 16a, 16b, 16c are constructed to have different current capacities. The current capacity of each of the output circuits 16a to 16c is set to be proportional to 2 to the power of N, where N is 0, k−1, and k, and k is a predetermined natural number. In the present embodiment, in a situation where the current capacity of the output circuit 16a is set to "1", the current capacity of the output circuit 16b is "2" and the current capacity of the output circuit 16c is "4". Accordingly, the ratio of the current capacities of the respective output circuits 16a to 16c are set as described above. In the present embodiment, the setting of the ratio of the current capacities of the respective output circuits 16a to 16c is described in the following.

In this situation, the sizes of the MOSFETs in the cascode circuit are mutually different. When the size of each of the MOSFETs M1a, M2a in the cascode circuit 25a in the output circuit 16a is set to "1", the size of each of the MOSFETs M1b, M2b in the cascode circuit 25b in the output circuit 16b is "2", and the size of each of the MOSFETs M1c, M2c in the cascode circuit 25c is "4". Accordingly, the size of each of the MOSFETs is set as described above.

According to the above structure, the value of the gate current Ig can be changed in eight ways. According to the above structure, in a situation where the value of the gate current Ig when the output circuit 16a is turned on while the output circuits 16b, 16c are turned on is set to "1", it is possible to change the value of the gate current Ig in eight levels being "0", "1", "2", "3", "4", "5", "6", and "7".

(Operation Timing of Each Part During Switching)

Figure 5:
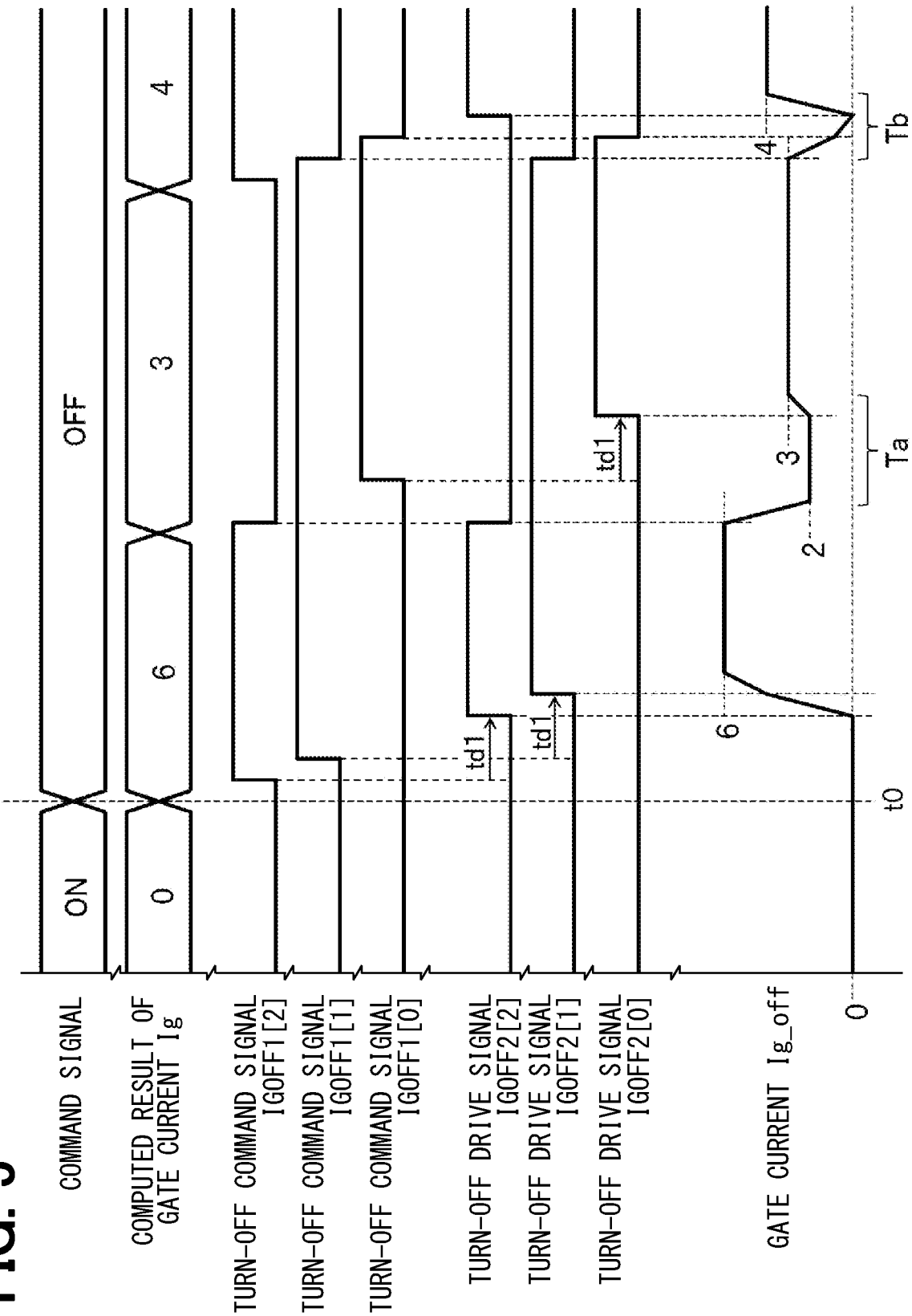
FIG. 5 is a timing chart for illustrating an operation timing of each part in the gate driver when the semiconductor switching element according to the first embodiment is turned off.

The following describes the operation timing of each part in the gate driver 4 during the switching of the semiconductor switching element 7 with reference to FIG. 5. In one or more embodiments including the present embodiment, the operation timing of each part during the turn-on of the semiconductor switching element 7 is described. However, the operation timing of each part during the turn-off of the semiconductor switching element 7 is substantially identical except the difference between the turn-on and the turn-off. In FIG. 5, for the command signal Sa, a period during which the level indicates the turn-on command is expressed as "ON", and a period during which the level indicates the turn-off command is expressed as "OFF".

In FIG. 5 or the like, the command value of the gate current Ig_off computed by the arithmetic circuit 11 is expressed as computed result, and the command value is expressed as the above-mentioned changeable eight-level value. In this situation, the arithmetic circuit 11 switches the command value of the gate current Ig_off indicated by the current command signal in three levels such as "6", "3" and "4" in order. At the time t0, when the command signal Sa indicating the turn-on command is provided from the controller 5, the arithmetic circuit 11 outputs the 3-bit turn-off command signal IGOFF1[2:0] as the current command signal related to the turn-off to the pre-drive circuit 14.

Subsequently, the pre-drive circuit 14 receives the 3-bit turn-off drive signal IGOFF1[2:0]. However, there is a difference in the propagation time caused by, for example, the difference among the propagation path or the difference among the elements. In this situation, with the operation of the glitch suppressor 21, the pre-drive circuit 14 outputs the 3-bit turn-off drive signal IGOFF2[2:0] as a signal acquired by setting the turn-on command edge to be later than the turn-off command edge by a predetermined time. For the clarity of explanation, the second delay time provided to the turn-off command edge is zero. In FIG. 5, the first delay time provided to the turn-on command edge is expressed as a symbol td1.

In this situation, when the command value of the gate current Ig_off is switched, the periods Ta, Tb during which the gate current Ig_off is turned to a value deviated from the command value due to the influence of glitch are present. When the countermeasure of setting the turn-on command edge to be later than the turn-off command edge by only a predetermined time through the glitch suppressor 21, the generation of glitch in which the gate current Ig_off becomes larger than the command value can be prevented. A glitch is a sharp pulse-like waveform caused by a difference in a signal delay time.

According to the present embodiment described above, the following effects are obtained. The following describes the advantageous effects attained by the gate driver 4 according to the present embodiment by a comparison between the first comparative example and the present embodiment with reference to FIGS. 6, 7. The following describes the comparison between the structure illustrated in FIG. 1 related to the first comparative example and the gate driver 4 according to the present embodiment. In the structure related to the first comparative example, by changing a value of the reference voltage Vref of a reference power supply 32, it is possible to change a voltage applied to a shunt resistor 20, in other words, a voltage "Vcc−Vm" acquired by subtracting a voltage Vm of an inverting input terminal of an operational amplifier 34 from a power supply voltage Vcc of a power supply 40. As a result, it is possible to operate the gate current of a load 10 being IGBT.

Figure 6:
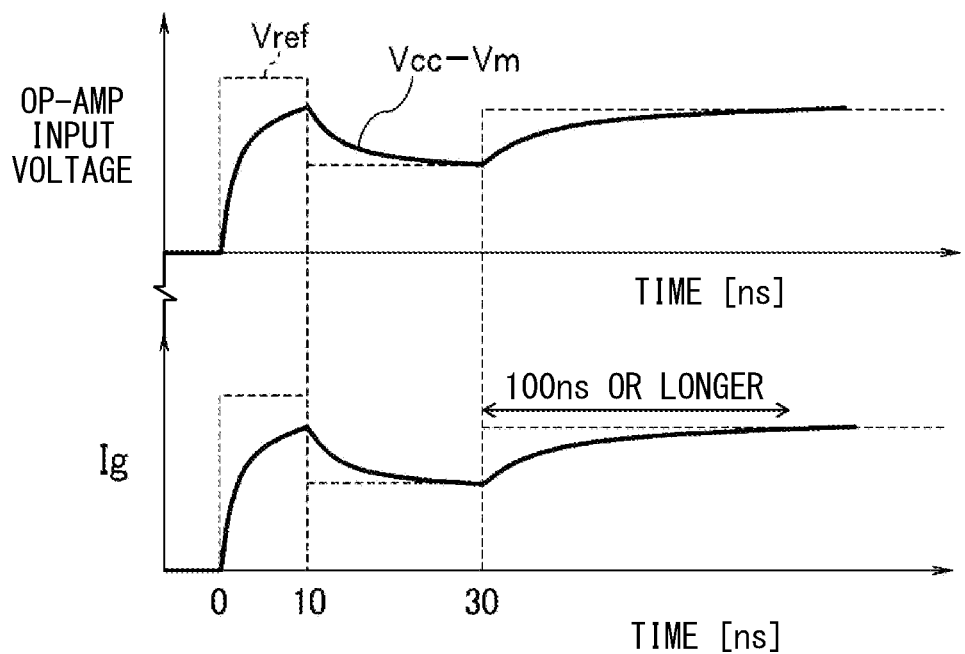
FIG. 6 is a timing chart schematically illustrating respective waveforms of parts when a gate current is changed during gate switching according to a first comparative example.
Figure 7:
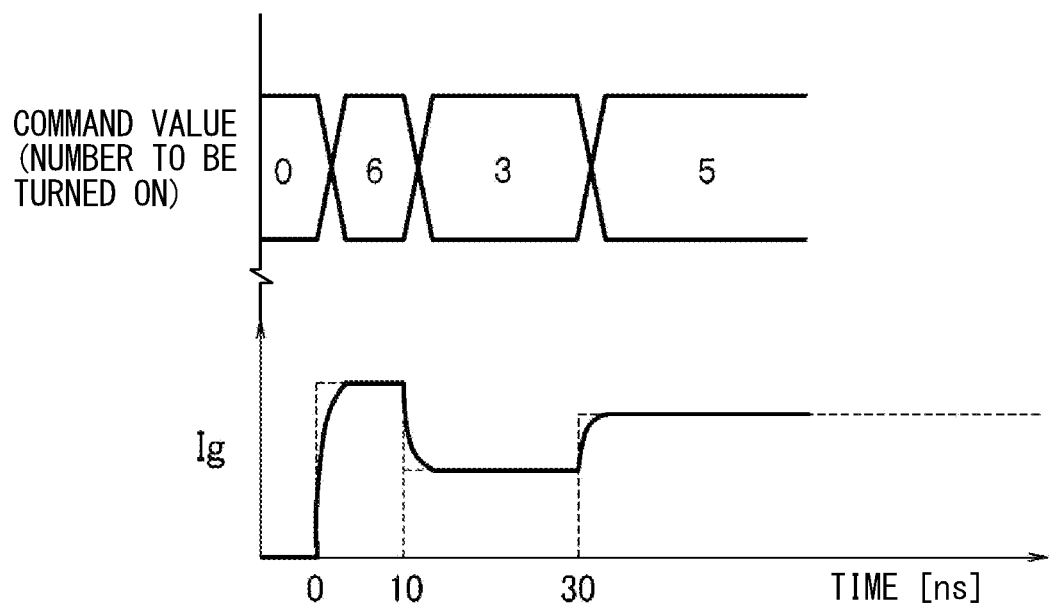
FIG. 7 is a timing chart schematically illustrating respective waveforms of parts when a gate current is changed during gate switching according to the first embodiment.

As illustrated in FIG. 6, in the first comparative example with such a structure, in a situation where the gate current Ig is changed during the gate switching, it is not possible to switch the gate current Ig at a high speed through the delay of a feedback loop through the operational amplifier 34. As illustrated in FIG. 6, in a situation where the gate current Ig is changed in the first comparative example, it may take 100 nanoseconds (ns) or longer for the gate current Ig to reach a desired value. In FIGS. 6 and 7, an ideal waveform of the gate current Ig is indicated by a dashed line.

In contrast, in the gate driver 4 according to the present embodiment, the delay from the time where the command value of the gate current Ig changes to the time where the gate current Ig actually changes is mainly caused by only the propagation delay in the MOSFETs M1a to M2c of the output circuits 16a to 16c. Therefore, it is possible to switch the gate current Ig at a higher speed as compared with the first comparative example. In other words, it is possible to enhance the responsiveness in the control of the gate current Ig. As illustrated in FIG. 7, in a situation where the gate current Ig is changed in the gate driver 4 according to the present embodiment, it may take only about 10 ns for the gate current Ig to reach a desired value. Moreover, it is not necessary to provide an operational amplifier in the gate driver 4 according to the present embodiment, so that the circuitry size does not increase as compared with the first comparative example.

Figure 8:
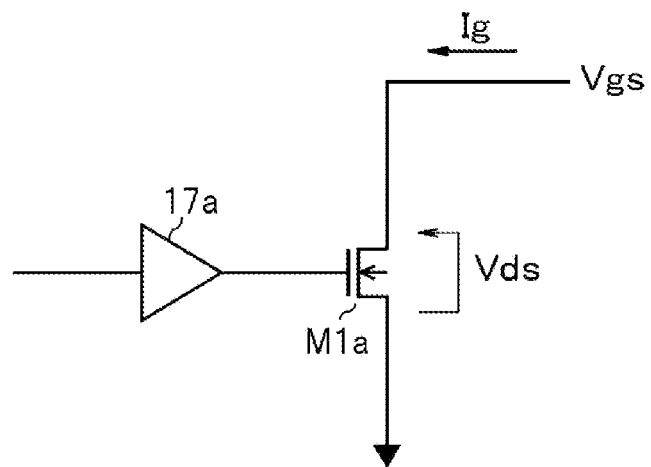
FIG. 8 schematically illustrates a structure of an output circuit according to a second comparative example.
Figure 9:
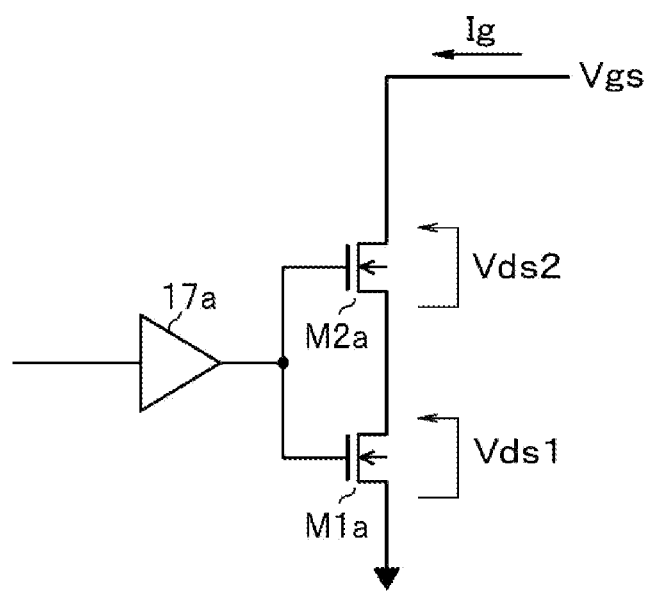
FIG. 9 schematically illustrates a structure of an output circuit according to the first embodiment.

The following describes the advantageous effects attained by the gate driver 4 according to the present embodiment by a comparison between the second comparative example and the present embodiment with reference to FIGS. 8 to 12. FIGS. 8, 9 illustrate that the output circuit 16a as one of the output circuits 16a to 16c connected in parallel on the turn-off side is extracted for explanation. In the second comparative example, as similar to the present embodiment, the gate current Ig is controlled by changing the number of the output circuits to be turned on. However, in the second comparative example, the output circuit has one MOSFET. In other words, the output circuit according to the second comparative example is without the MOSFET M2a of the output circuit 16a according to the present embodiment, as illustrated in FIG. 8.

Figure 10:
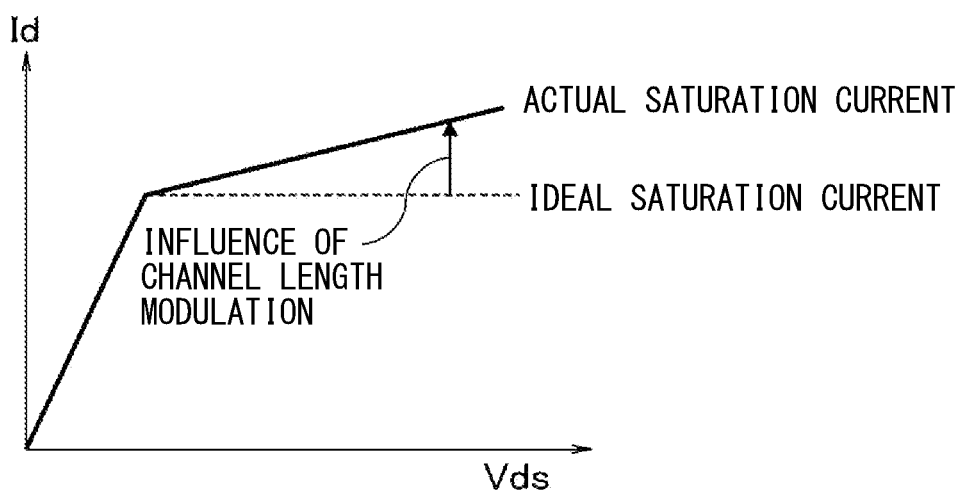
FIG. 10 illustrates a relationship between a drain current of a metal-oxide-semiconductor field-effect transistor (MOSFET) and a voltage between a drain and a source of the MOSFET.

In this situation, the drain of the MOSFET M1a is connected to the gate of the semiconductor switching element 7. In such a structure, the saturation current of the MOSFET M1a changes according to the voltage Vds of the MOSFET M1a through a channel length modulation effect. In other words, as illustrated in FIG. 10, it is ideal that the saturation current of the current Id of the MOSFET M1a does not change according to the voltage Vds. However, the saturation current actually changes according to the voltage Vds by the influence of the channel length modulation. FIG. 10 illustrates that the actual saturation current is expressed by a solid line, and the ideal saturation current is expressed by a dashed line.

Since the voltage Vgs between the gate and source of the semiconductor switching element 7 during the flow of the gate current Ig, in other words, during the output of the gate current Ig, the voltage Vds of the MOSFET M1a also changes accordingly. As a result, the current Id of the MOSFET M1a changes, and thus it is not possible to output a constant gate current Ig. In other words, the precision of the gate current Ig is relatively low in the second comparative example. In the following description, the voltage Vgs between the gate and source is simply referred to as the voltage Vgs.

In contrast, as illustrated in FIG. 9, the output circuit 16a according to the present embodiment has a structure in which two MOSFETs M1a, M2a are cascode-connected. According to the above structure, since a change in the voltage Vgs of the semiconductor switching element 7 is absorbed by the voltage Vds between the drain and source of the MOSFET M2a being different from the MOSFET M1a on a common source side, the voltage Vds between the drain and source of the MOSFET M1a on the common source side is kept substantially constant. In this situation, the value of the gate current Ig is determined mainly according to the MOSFET M1a.

Figure 11:
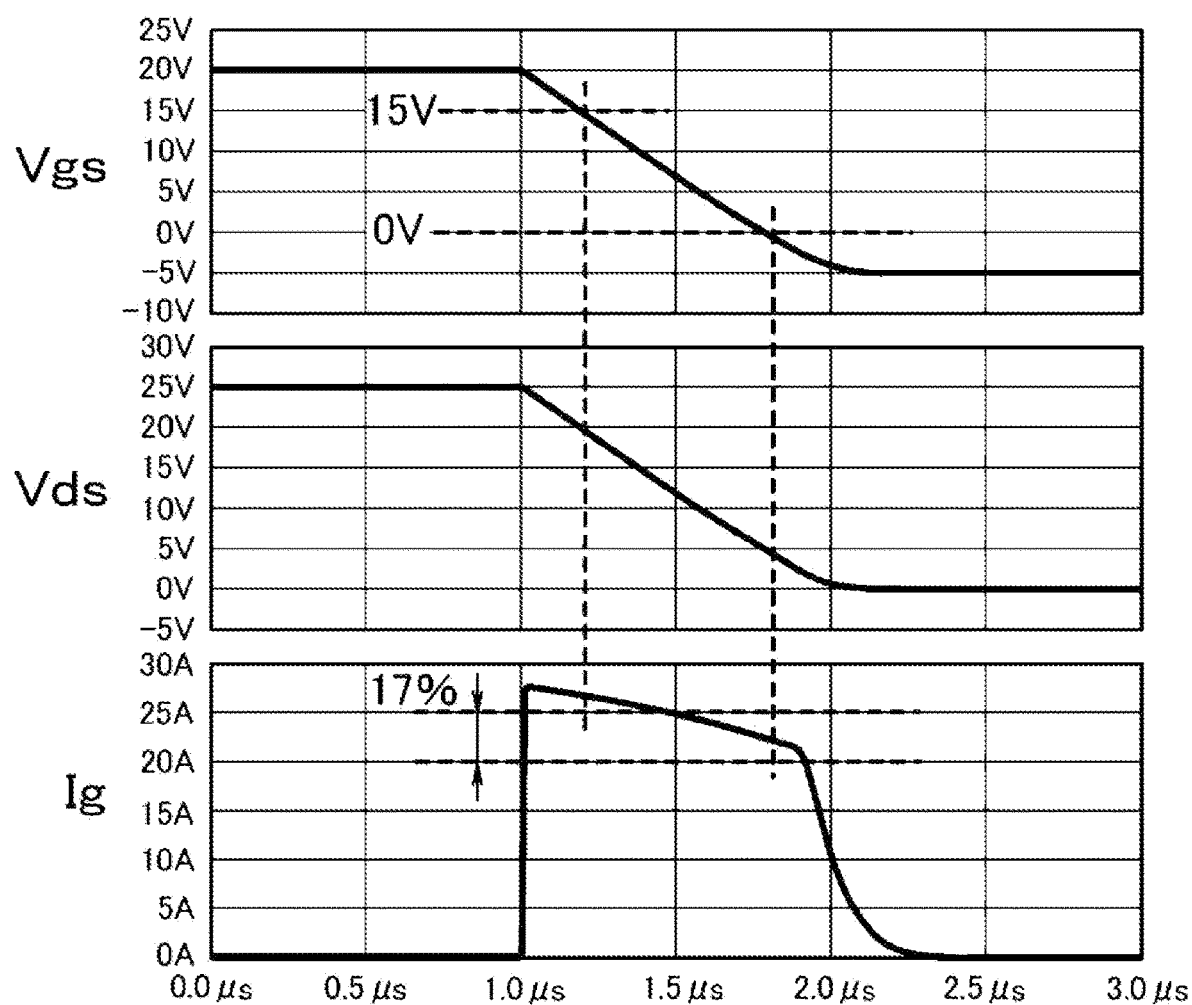
FIG. 11 illustrates a simulation result related to the second comparative example, and schematically illustrates respective waveforms of parts when the semiconductor switching element is turned off.
Figure 12:
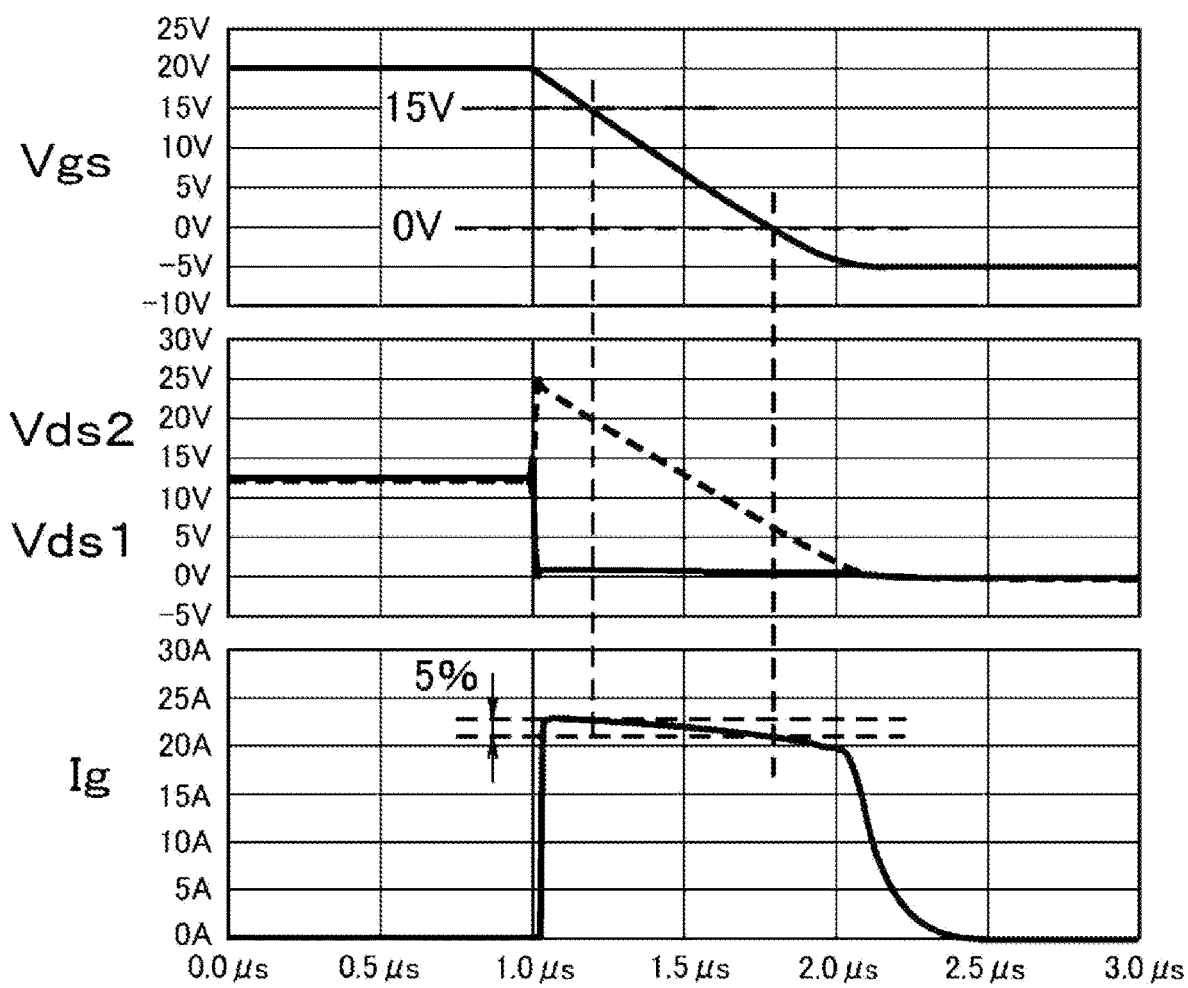
FIG. 12 illustrates a simulation result related to the first embodiment, and schematically illustrates respective waveforms of parts when the semiconductor switching element is turned off.

According to the above structure in the present embodiment, even though the channel length modulation is present, a change in the gate current Ig along with a change in the voltage Vgs of the semiconductor switching element 7 is suppressed. Therefore, it is possible to enhance the precision of the gate current Ig in the present embodiment as compared with the second comparative example. The advantageous effect attained in the present embodiment can be obvious based on the simulation results illustrated in FIGS. 11, 12. FIG. 11 illustrates a waveform of a voltage in each part and a waveform of a current during the turn-off of the semiconductor switching element in the second comparative example. FIG. 12 illustrates a waveform of a voltage in each part and a waveform of a current during the turn-off of the semiconductor switching element 7 in the present embodiment.

As illustrated in FIG. 11, in a period during which the voltage Vgs changes from 15 V to 0 V, the gate current Ig changes by about 17% in the second comparative example. As illustrated in FIG. 12, in a period during which the voltage Vgs changes from 15 V to 0 V, the gate current Ig changes by about 5% in the present embodiment. In the second comparative example, since the voltage Vds of the MOSFET M1a changes according to a change in the voltage Vgs of the semiconductor switching element 7, a change in the gate current Ig becomes larger.

In contrast, as illustrated in FIG. 12, the voltage Vds of the MOSFET M2a connected in a cascode arrangement changes according to a change in the voltage Vgs of the semiconductor switching element 7. In other words, a changing portion of the voltage Vgs of the semiconductor switching element 7 is shared on the MOSFET M2a side. Therefore, the voltage Vds1 of the MOSFET M1a as a main device to determine the value of the gate current Ig is kept substantially constant regardless of a change in the voltage Vgs of the semiconductor switching element 7. As a result, it is possible to suppress a change in the gate current Ig. In FIG. 12, the voltage Vds1 is expressed by a solid line, and the voltage Vds2 is expressed by a broken line.

In the structure according to the second comparative example, in a situation where the resolution of the switching of the gate current Ig is to be enhanced, the circuitry size increases as it is required to have more pre-drive circuits. In the structure according to the second comparative example, for switching the gate current Ig in 64 levels, it is required to provide 63 output circuits. Therefore, it is also required to provide 63 pre-drive circuits for driving 63 output circuits. A drive circuit 12 and a pre-driver 18 in the second comparative example correspond to the circuits in the output circuits 16a to 16c and the pre-drive circuit 14 in the present embodiment.

In contrast, in the present embodiment, the respective current capacities of the output circuits 16a to 16c, in particular, the respective sizes of the MOSFETs M1a to M2c are set to be proportional to 2 to the power of N. Therefore, in a situation where the gate current Ig is switched in 64 levels as similar to the second comparative example, it is possible to provide only six structures identical to the output circuits 16a to 16c, and it is possible to provide only six structures identical to the circuits in the pre-drive circuit 14. According to the present embodiment, it is possible to reduce the circuitry size to have about the same level of the resolution of switching the gate current Ig as compared with the second comparative example.

Based on the above reason, the pre-drive circuit 14 is often provided with the level shift circuits 22a to 22c. The level shift circuits 22a to 22c require a desired breakdown voltage, the circuitry size tends to be larger. For this reason, the effect of reducing the circuitry size attained in the present embodiment is remarkable in a situation where the pre-drive circuit 14 is provided with the level shift circuits 22a to 22c. As described above, according to the structure in the present embodiment, it is possible to change the gate current Ig with higher precision and without enlarging the circuitry size, while enhancing the responsiveness in the control of the gate current Ig.

In the present embodiment, the pre-drive circuit 14 includes output buffers 17a, 17b, 17c respectively provided for the output circuits 16a, 16b, 16c of the drive circuit 15. The output circuits 16a to 16c are constructed to have different current capacities, and the output buffers 17a to 17c respective have buffer capacities for the respective output circuits 16a to 16c. With such a structure, since the propagation delay in each of the MOSFETs M1a to M2c in the output circuits 16a to 16c is equalized, it is possible to bring the time required for turning on and off the MOSFETs M1a to M2c into uniformity. As a result, it is possible to suppress the generation of glitch.

The pre-drive circuit 14 includes the glitch suppressor 21 for the command signals. The glitch suppressor 21 is constructed to set the turn-on command edge as the edge changed from the second level to the first level to be later than the turn-off command edge as the edge changed from the first level to the second level. The pre-drive circuit 14 generates a drive signal and then outputs the drive signal, such that a first delay time is longer than a second delay time. The first delay time is a time required for the MOSFETs M1a to M2c to switch from an off-state to an on-state. The second delay time is a time required for the MOSFETs M1a to M2c to switch from the on-state to the off-state.

Figure 13:
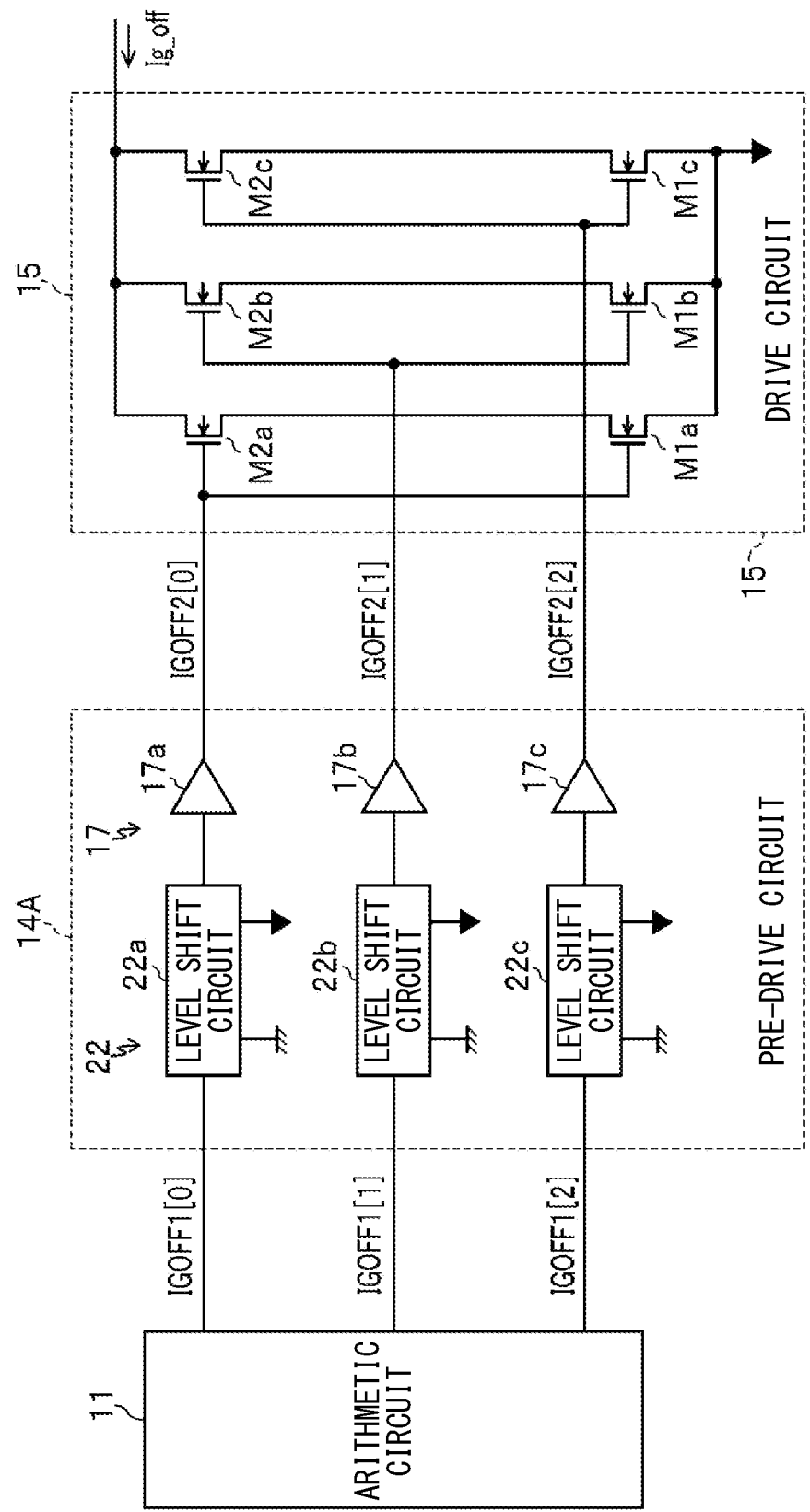
FIG. 13 illustrates an example of the structure of the gate driver according to a first comparative example.

The following describes the advantageous effects attained in the above structure while comparing the structure according to the present embodiment with the first comparative example without the glitch suppressor 21. FIG. 13 illustrates only the structure related to the turn-off in the gate driver according to first comparative example. As illustrated in FIG. 13, a pre-drive circuit 14A in the first comparative example is different from the pre-drive circuit 14 according to the present embodiment such that the pre-drive circuit 14A in the first comparative example does not have the glitch suppressor 21. In this situation, the turn-off command signal IGOFF1[2:0] is directly sent to the level shifter 22.

Figure 14:
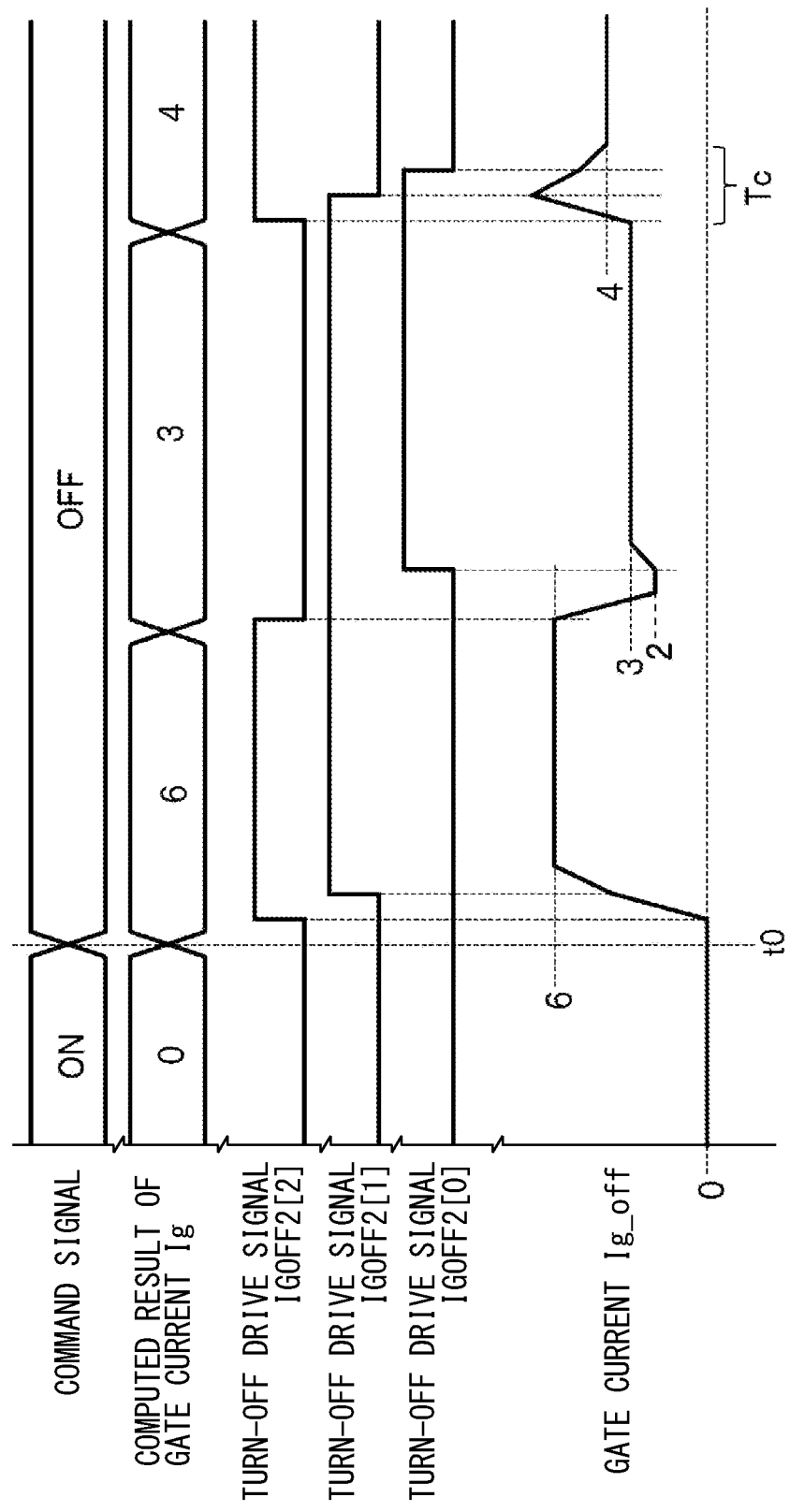
FIG. 14 illustrates a timing chart for describing an operation timing of each part in the gate driver when the semiconductor switching element according to the first comparative example is turned off.

In the structure according to the first comparative example, the turn-off drive signal IGOFF2[2:0] output from the pre-drive circuit 14A provides a delay time according to propagation delay in each of the paths of the turn-off command signals included in IGOFF1[2:0] to each corresponding one of the turn-off command signals included in IGOFF1[2:0]. As illustrated in FIG. 14, due to the propagation delay in each path, the glitch in which the gate current Ig_off becomes larger than the command value, in other words, a period Tc during which the excessive amount of the gate current Ig_off is generated is present. In a case where the excessive amount of the gate current Ig_off is generated, it is possible to have, for example, a fault in the semiconductor switching element 7 caused by the excessive amount of the surge voltage Vsrg and an erroneous operation of peripheral devices due to an increase in EMI.

In contrast, in the present embodiment, the glitch suppressor 21 provided in the pre-drive circuit 14 sets the turn-on command edge of the drive signal IGOFF2[2:0] to be later than the turn-off command edge by only a predetermined time. As a result, it is possible to avoid the generation of glitch in which the gate current Ig_off becomes larger than the command value. According to the present embodiment, it is possible to suppress the generation of transiently excessive amount of the gate current. Therefore, it is possible to avoid the generation of the excessive amount of the surge voltage Vsrg and an increase in EMI.

The gates of two MOSFETs in each of the cascode circuits 25a to 25c according to the present embodiment are commonly connected. Since an additional bias voltage circuit is not required, it is possible to suppress a change in the gate current Ig with the simplest structure.

(Modification of Command Signal Output Circuit)

In the present embodiment, the arithmetic circuit 11 is adopted as the command signal output circuit. The arithmetic circuit 11 outputs the current command signal indicating the result acquired by computing the command value of the gate current Ig based on the element relevant information. However, it is also possible to adopt, for example, a structure for outputting the current command signal indicating the predetermined command value of the gate current Ig.

In the present embodiment, the arithmetic circuit 11 as the command signal output circuit outputs the 3-bit turn-on command signal IGON1[2:0] and the 3-bit turn-off command signal IGOFF1[2:0]. However, for the command signal output circuit, it is also possible to provide the current command signal having multiple command signals, in other words, a 2-bit or more command signal.

In the present embodiment, the arithmetic circuit as the command signal output circuit switches the command value indicated by the current command signal on the turn-on side and the turn-off side in two levels or more. However, the switching of such a command value may also be applied to only one of the turn-on side and the turn-off side. For example, in a case where the surge voltage Vsrg on the turn-off side is excessively larger than the surge voltage Vsrg on the turn-off side, the switching of the command value may be applied to the turn-off side.

(Modification of Pre-Drive Circuit)

In the present embodiment, each of the glitch suppression circuits 21a to 21c includes the RC filter 23 and the AND circuit 24. However, the specific structure of each of the glitch suppression circuits 21a to 21c can be properly modified as long as the identical functions can be attained. In the present embodiment, the glitch suppressor 21 is arranged prior to the level shifter 22. However, the glitch suppressor 21 can be arranged subsequent to the level shifter 22.

In the present embodiment, the glitch suppression circuits 21a to 21c are provided for multiple command signals, in other words, multiple output circuits 16a to 16c. However, the glitch suppression circuit may be provided for at least one of the multiple command signals. For example, the glitch suppression circuit may be provided for only the output circuit 16c having the largest size of the MOSFET as compared with other MOSFETs in the output circuits 16a, 16b. Even in this situation, since the effect of suppressing the glitch can be acquired to some extent, it is possible to suppress the generation of an excessive amount of the gate current Ig.

In the present embodiment, the pre-drive circuit 14 includes the level shifter 22. However, the level shifter 22 may be provided if necessary, or may be omitted. In the present embodiment, the buffer capacities of the output buffers 17a to 17c are set to desired values according to the sizes of the output buffers 17a to 17c. However, it is also possible to adjust the buffer capacity to a desired value by connecting output buffers with smaller size in parallel in each of the output circuits 16a to 16c and adjusting the number of the connected output buffers.

(Modification of Drive Circuit)

In the present embodiment, the respective sizes of two cascode-connected MOSFETs in each of the output circuits 16a to 16c are identical. However, two cascode-connected MOSFETs may have different sizes. In a situation where two MOSFETs have different sizes, one of two MOSFETs having a smaller saturation current restricts the gate current Ig. In the present embodiment, respective current capacities of the output circuits 16a to 16c are set to be proportional to two to the power of N. However, the respective current capacities may set to a variety of ratios such as "1:10".

In the present embodiment, the respective gates of two cascode-connected MOSFETs included in each of the cascode circuits 25a to 25c are commonly connected. In other words, an identical gate voltage is provided to the two cascode-connected MOSFETs included in each of the cascode circuits 25a to 25c. However, several modifications may be made for providing a gate voltage to the two MOSFETs. The following describes several modifications related to a structure for providing a gate voltage to the above-mentioned two cascode-connected MOSFETs.

The following describes an example in which the MOSFETs M1a, M2a included in the cascode circuit 25a in the turn-off driver 13 are adopted for describing several modifications. In addition, the following describes the MOSFET on the common source side as a first transistor, and the MOSFET different from the one on the common source side as a second transistor. Therefore, in the following, the MOSFET M1a is referred to as a first transistor M1a, and the MOSFET M2a is referred to as a second transistor M2a.

(First Modification)

Figure 15:
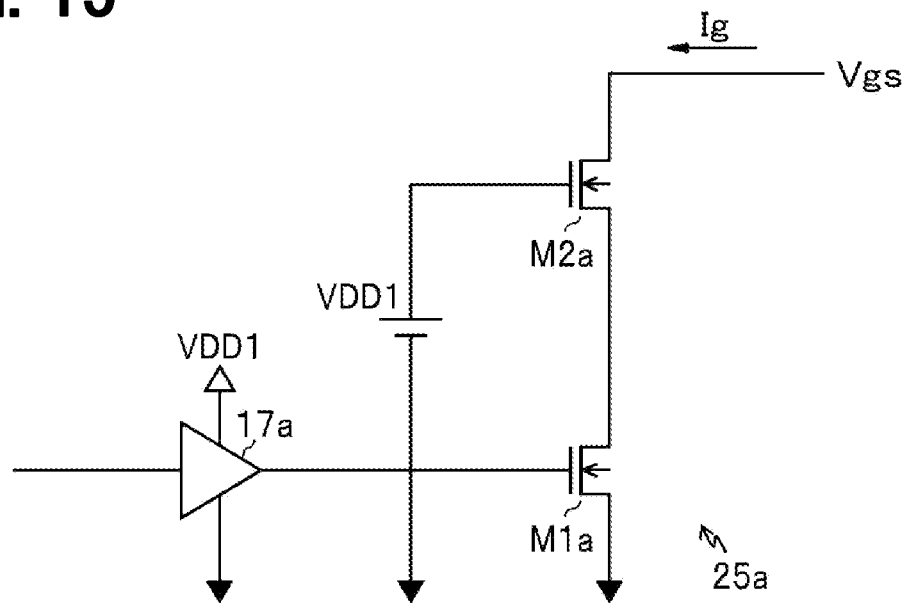
FIG. 15 schematically illustrates a structure of an output circuit related to a first modification of the first embodiment.

As illustrated in FIG. 15, in a structure related to a first modification, the turn-off drive signal IGOFF2[0] as the drive signal is provided to a gate of the first transistor M1a. The power supply voltage VDD maintains the output circuits 16a to 16c at the on-state. The power supply voltage VDD is supplied to the output buffers 17a to 17c of the pre-drive circuit 14. In this situation, a constant voltage identical to the power supply voltage VDD1 that maintains the first transistor M1a at the on-state is applied to the gate of the second transistor M2a. With such a structure, the second transistor M2a on the common gate side is operated in the on-state at all time. In other words, the second transistor M2a is operated constantly in the on-state.

According to the first modification, the following advantageous effects can be obtained. In the structure according to the first embodiment, when the gate current Ig is output, it is required that the pre-drive circuit 14 turns on both of the first transistor M1a and the second transistor M2a. In contrast, in the first modification, when the gate current Ig is output, the pre-drive circuit 14 may turn on only the first transistor M1a.

According to the first modification, the capacitive load driven by the pre-drive circuit, in other words, the input capacitance of the MOSFET being a driven target is reduced to about ½ as compared with the first embodiment. In other words, it is possible to output the gate current Ig at a higher speed in the first modification. According to the first modification, as long as the responsiveness can be sufficiently attained, it is possible to reduce the circuitry size by reducing the size of the output buffer 17a of the pre-drive circuit 14.

(Second Modification)

Figure 16:
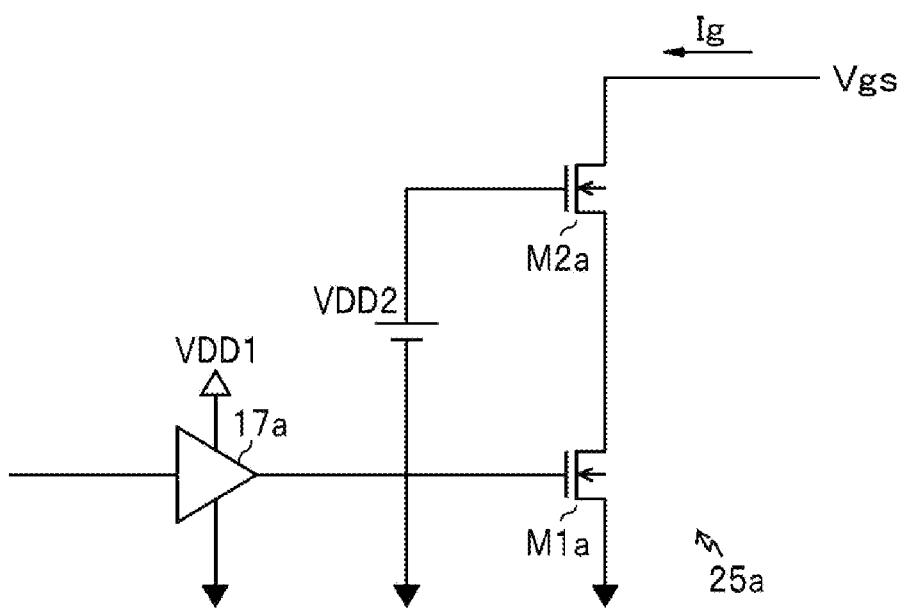
FIG. 16 schematically illustrates a structure of an output circuit related to a second modification of the first embodiment.

As illustrated in FIG. 16, a second modification is different from the first modification illustrated in FIG. 15 such that a voltage provided to the gate of the second transistor M2a is changed. In this situation, the power supply voltage VDD2 is applied to the gate of the second transistor M2a. The value of the power supply voltage VDD2 is set based on the following consideration. In the following, the voltage between the gate and source of the first transistor M1a is referred to as the voltage Vgs1, and the voltage between the gate and source of the second transistor M2a is referred to as the voltage Vgs2. In the following, the voltage between the drain and source of the first transistor M1a is referred to as the voltage Vds1, and the voltage between the drain and source of the second transistor M2a is referred to as the voltage Vds2.

In other words, in the second modification, the voltage Vgs2 is made to be higher than the voltage Vgs1. In other words, a voltage applied to the gate of the second transistor M2a is higher than a voltage applied to the gate of the first transistor M1a. Therefore, it is required that the power supply voltage VDD2 is higher than the power supply voltage VDD1. In other words, the power supply voltage VDD1 and the power supply voltage VDD2 are set to satisfy the following mathematical relation (1).

$$VDD1 < VDD2 \tag{1}$$

In order to execute the above-mentioned cascode operation, it is required that the voltage Vgs2 is lower than the voltage Vgs1. In the cascode operation, the voltage Vds2 changes according to the voltage Vgs of the semiconductor switching element 7 such that the voltage Vds1 is substantially constant regardless of a change in the voltage Vgs of the semiconductor switching element 7. In other words, the voltage Vgs1 and the voltage Vgs2 are set to satisfy the following mathematical relation (2).

$$Vgs2 < Vgs1 \tag{2}$$

In order to maintain the gate current Ig at the constant level, it is required to operate the first transistor M1a in the saturation region. In order to operate the first transistor M1a in the saturation region, each voltage of the first transistor M1a is required to satisfy the following mathematical relation (3). Vth denotes a gate threshold voltage of the first transistor M1a.

$$Vds1 > Vgs1 - Vth = VDD1 - Vth \tag{3}$$

The following mathematical relation (4) is derived from the above-mentioned mathematical relation (3).

$$Vgs2 = VDD2 - Vds1 < VDD2 - VDD1 + Vth \tag{4}$$

The following mathematical relation (5) is derived from the above-mentioned mathematical relations (2) and (4).

$$VDD2 - VDD1 + Vth < VDD1 \tag{5}$$

The following mathematical relation (6) is acquired by modifying the above-mentioned mathematical relation (5).

$$VDD2 < 2 \times VDD1 - Vth \tag{6}$$

The following mathematical relation (7) is derived from the above-mentioned mathematical relations (1) and (6).

$$VDD1 < VDD2 < 2 \times VDD1 - Vth \tag{7}$$

The power supply voltage VDD2 is a voltage that satisfies the above-mentioned mathematical relation (7). In other words, the power supply voltage VDD2 is a constant voltage that is higher than the power supply voltage VDD1, and that is lower than a voltage acquired by subtracting the gate threshold voltage Vth of the first transistor M1a from twice the power supply voltage VDD1. With such a structure, as similar to the first modification, the second transistor M2a on the common gate side is operated in the on-state at all time. In other words, the second transistor M2a is operated in a constantly-on-state.

The second modification attains the following advantageous effects in addition to the effects in the first modification. As compared with the first modification, it is possible to apply a relatively high voltage Vgs2 to the second transistor M2a in the second modification. As a result, it is possible to output a relatively large gate current Ig in the second modification. In other words, according to the second embodiment, in a situation of outputting a specified gate current Ig, it is possible to reduce the size of the MOSFETs M1a, M2a of the output circuit 16a as compared with the first modification. Accordingly, since it is possible to reduce the output buffer 17a of the pre-drive circuit 14, the circuitry size can be greatly reduced.

Figure 17:
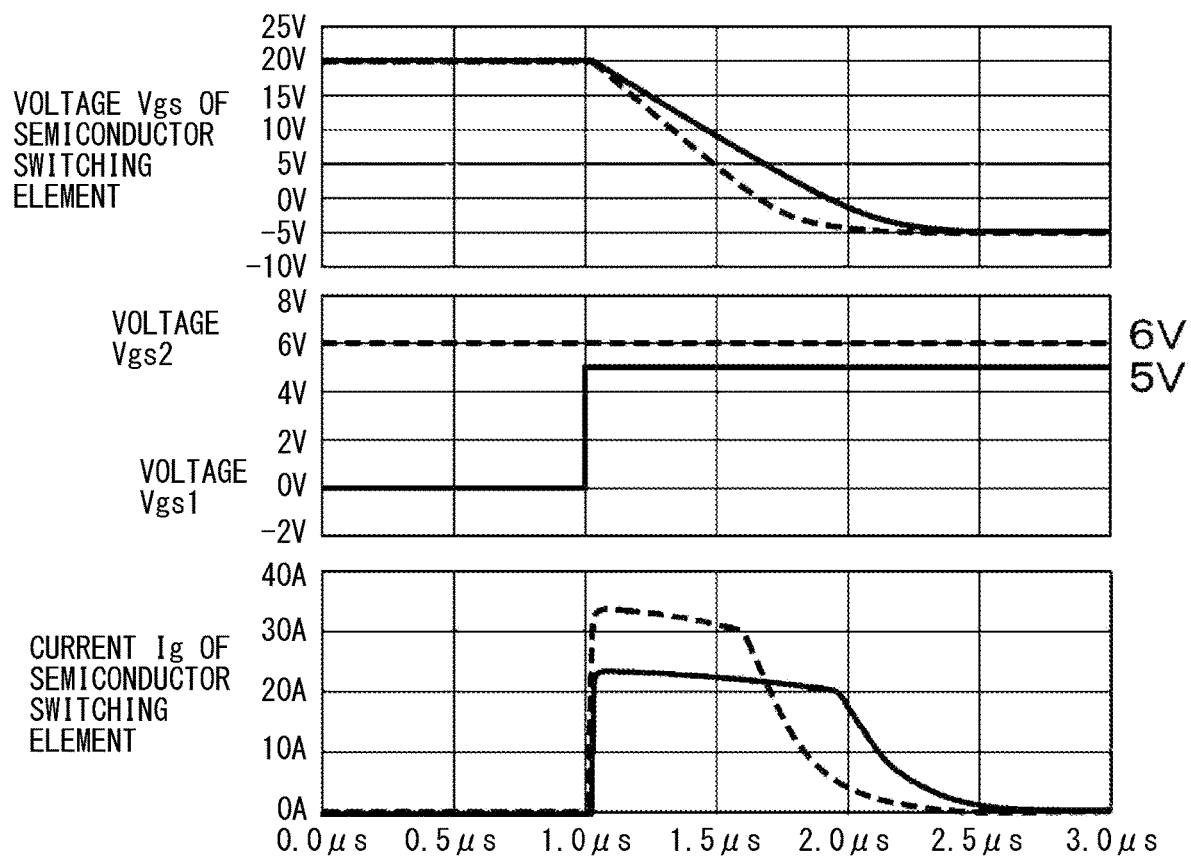
FIG. 17 illustrates a simulation result related to the second modification of the first embodiment, and schematically illustrates respective waveforms of parts when the semiconductor switching element is turned off.

It is obvious from the simulation result illustrated in FIG. 17 that it is possible to output a relatively large gate current Ig in the second modification as compared with the first modification. With regard to the voltage Vgs and the gate current Ig of the semiconductor switching element 7, in FIG. 17, a waveform corresponding to the first modification is expressed by a solid line, and a waveform corresponding to the second modification is indicated by a dashed line. In FIG. 17, the output of the output buffer 17a of the pre-drive circuit 14, in other words, the voltage Vgs1 of the first transistor M1a is expressed by a solid line, and the power supply voltage VDD2, in other words, the voltage Vgs2 of the second transistor M2a is expressed by a dashed line.

In this situation, the power supply voltage VDD1 in each of the first and the second modifications is set to 5 V, and the power supply voltage VDD2 in the second modification is set to 6 V. As illustrated in FIG. 17, in the second modification, the voltage Vgs2 of the second transistor M2a is 1 V higher than the voltage Vgs1 of the first transistor M1a. In other words, the voltage Vgs2 of the second transistor M2a in the second modification is 1 V higher than the voltage Vgs of the second transistor M2a in the first modification. In the second modification, for example, when the voltage Vgs of the semiconductor switching element 7 is 10 V, the gate current Ig output in the second modification is increased by about 39% as compared with the first modification.

(Third Modification)

Figure 18:
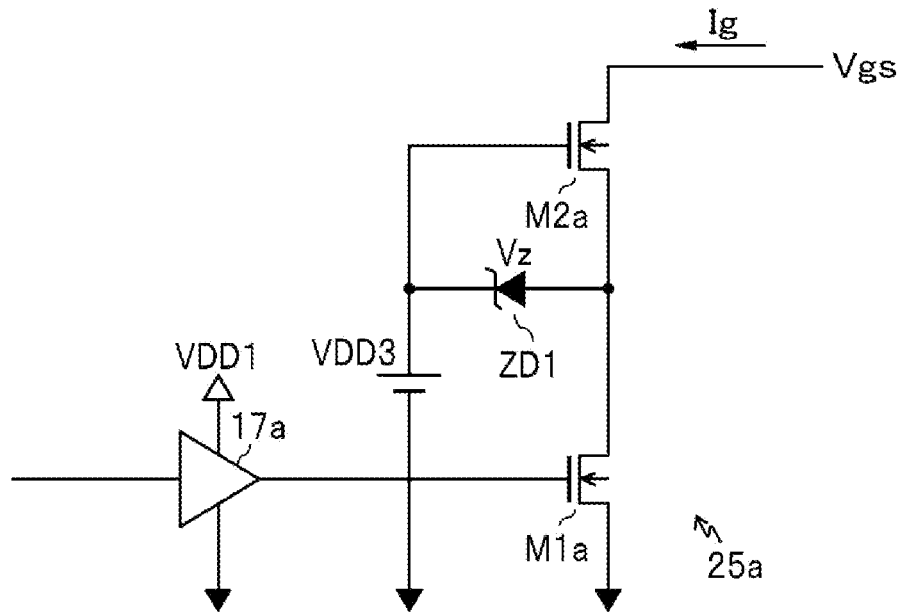
FIG. 18 schematically illustrates a structure of an output circuit according to a third modification of the first embodiment.

As illustrated in FIG. 18, a third modification is different from the first modification illustrated in FIG. 15 such that a voltage provided to the gate of the second transistor M2a is changed, and such that a Zener diode ZD1 is added. In this situation, the power supply voltage VDD3 is applied to the gate of the second transistor M2a. As shown in the following mathematical relation (8), the power supply voltage VDD3 is a constant voltage that is higher than the power supply voltage VDD1.

$$VDD1 < VDD3 \qquad (8)$$

In this situation, the cascode circuit 25a further includes the Zener diode ZD1 connected between the gate and source of the second transistor M2a. As shown in the following mathematical relation (9), a Zener voltage Vz of the Zener diode ZD1 is a voltage lower than the power supply voltage VDD1.

$$Vz < VDD1 \qquad (9)$$

With such a structure, as similar to the second modification, the second transistor M2a on the common gate side is operated in the on-state at all time. In other words, the second transistor M2a is operated in a constantly-on-state. In the above structure, the voltage Vgs2 of the second transistor M2a, through the function of the Zener diode ZD1, is limited to a voltage lower than the power supply voltage VDD1, in other words, a voltage lower than the voltage Vgs1 of the first transistor M1a. Therefore, the third modification attains the advantageous effect identical to the one in the second modification. The structure for limiting the voltage Vgs2 may not be limited to the Zener diode ZD1, but may also be modified as long as the structure can limit the voltage Vgs2.

(Fourth Modification)

Figure 19:
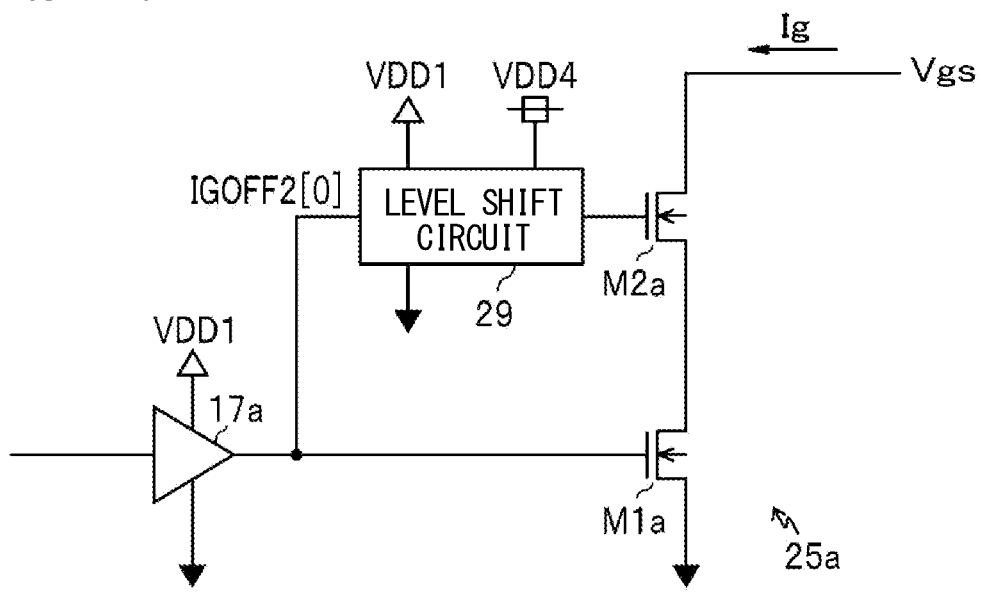
FIG. 19 schematically illustrates a structure of an output circuit related to a fourth modification of the first embodiment.

As illustrated in FIG. 19, a fourth modification is different from the first modification illustrated in FIG. 15 such that a voltage provided to the gate of the second transistor M2a is changed. The cascode circuit 25a further includes a level shift circuit 29. The level shift circuit 29 outputs a signal acquired by shifting the level of the turn-off drive signal IGOFF2[0] to a higher voltage. The output signal of the level shift circuit 29 is provided to the gate of the second transistor M2a. In this situation, the signal acquired by shifting the level of the turn-off drive voltage IGOFF2[2:0] as a drive signal to a higher voltage is provided to the gate of the second transistor M2a. According to such a structure, the second transistor M2a is switched between the on-state and off-state at a timing identical to the first transistor M1a.

In this situation, the level shift circuit 29 outputs a signal acquired by raising the high level of the turn-off drive signal IGOFF[2:0] from the power supply voltage VDD1 to the power supply voltage VDD4. The value of the power supply voltage VDD4 can be set based on the concept identical to the power supply voltage VDD2 in the second modification. The value of the power supply voltage VDD4 can be set based on the concept identical to the power supply voltage VDD3 in the third modification. However, in this situation, it is required to add the Zener diode ZD1 as similar to the third modification.

As compared with the first modification, it is possible to apply a relatively high voltage Vgs2 to the second transistor M2a in the fourth modification. As a result, it is possible to output a relatively large gate current Ig in the fourth modification. In other words, according to the fourth embodiment, in a situation of outputting a specified gate current Ig, it is possible to reduce the size of the MOSFETs M1a, M2a of the output circuit 16a as compared with the first modification. Accordingly, since it is possible to reduce the output buffer 17a of the pre-drive circuit 14, the circuitry size can be greatly reduced.

Second Embodiment

Hereinafter, a second embodiment in which a specific structure of the gate driver has been changed with respect to the first embodiment will be described with reference to FIGS. 20 to 22.

(Structure of Gate Driver)

Figure 20:
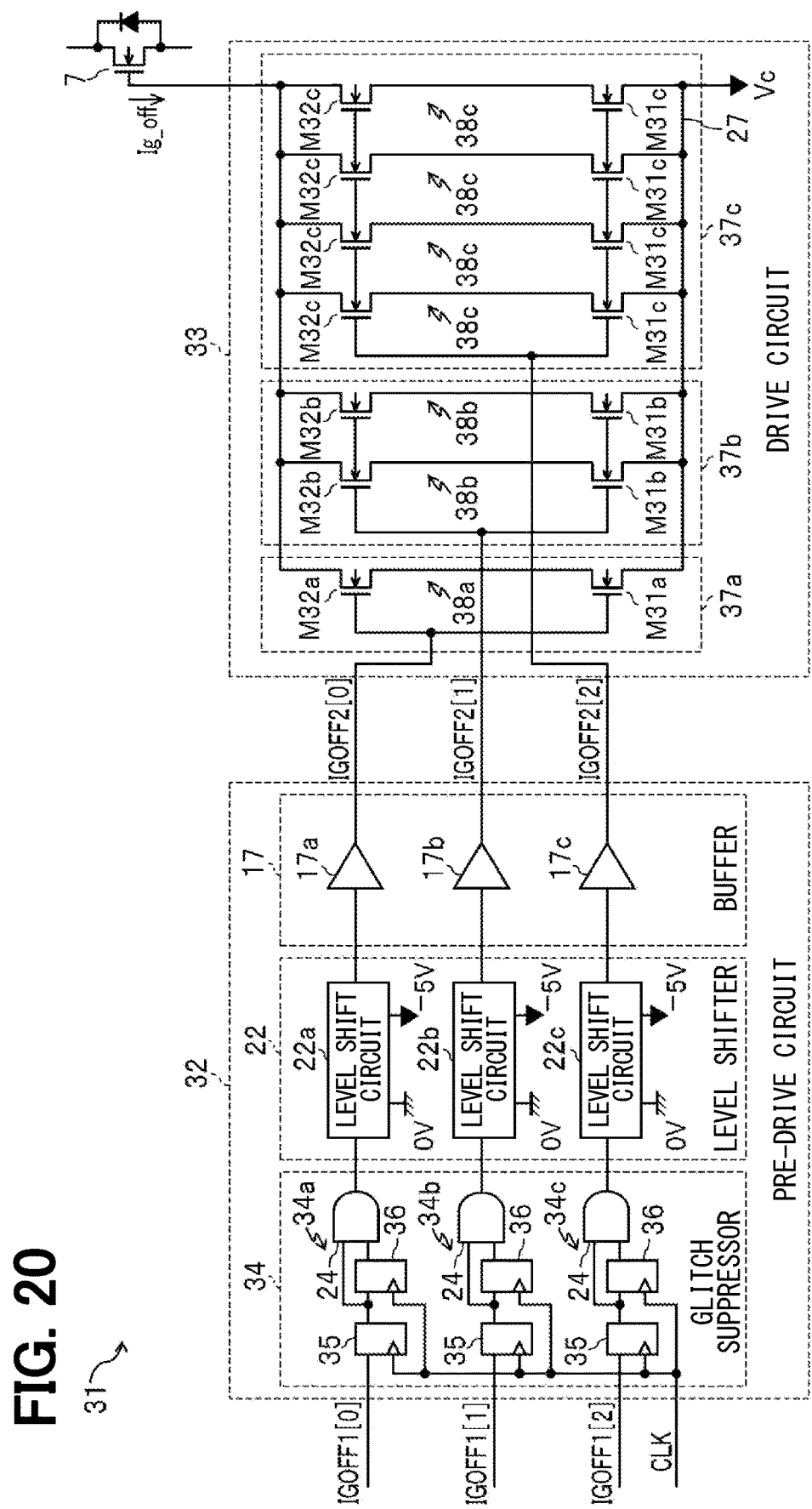
FIG. 20 illustrates an example of a structure of a gate driver according to the second embodiment.

As shown in FIG. 20, a gate driver 31 according to the present embodiment is different from the gate driver 4 according to the first embodiment in that a pre-drive circuit 32 is provided in place of the pre-drive circuit 14, and that a drive circuit 33 is provided in place of the drive circuit 15. Although FIG. 20 illustrates only the structure of the gate driver 31 on the turn-off side, the structure on the turn-on side may also adopt a structure identical to the above-mentioned structure.

The pre-drive circuit 32 is different from the pre-drive circuit 14 such that a glitch suppressor 34 is provided in place of the glitch suppressor 21. The glitch suppressor 34 includes three glitch suppression circuits 34a, 34b, 34c for executing the function identical to the glitch suppressor 21; however, the circuitry structure of each of the glitch suppression circuits 34a, 34b, 34c is different from the glitch suppressor 21. In other words, each of the glitch suppression circuits 34a to 34c is different from each of the glitch suppression circuits 21a to 21c such that flip-flops 35, 36 are provided in place of the RC filter 23. The flip-flops 35, 36 are connected in two stages.

The flip-flop 35 is a first-stage flip-flop. An input terminal of the flip-flop 35 serves as an input terminal of each of the glitch suppression circuits 34a to 34c, and receives the turn-off command signal IGOFF1[2:0]. The flip-flop 36 is a second-stage flip-flop provided after the flip-flop 35. An output terminal of the flip-flop 35 is connected to an input terminal of the flip-flop 36, and is connected to one of the input terminals of the AND circuit 24. An output terminal of the flip-flop 36 is connected to the other one of the input terminals of the AND circuit 24. Respective clock terminals of the flip-flops 35, 36 receive a clock signal CLK. The output terminal of the AND circuit 24 functions as the output terminal of each of the glitch suppression circuits 34a to 34c.

The drive circuit 33 includes three output circuits 37a, 37b, 37c for executing the function identical to the drive circuit 15; however, the circuitry structure of each of the output circuits 37a, 37b, 37c is different from the drive circuit 15. In this situation, each of the output circuits 37a to 37c has different number of cascode circuits. The output circuit 37a incudes a cascode circuit 38a in which two MOSFETs M31a, M32a are cascode-connected. In other words, the output circuit 37a has one cascode circuit 38a.

The output circuit 37b includes two sets of a cascode circuit 38b, and each set includes two MOSFETs M31b, M32b that are cascode-connected. In other words, the output circuit 37b includes two cascode circuits 38b. The output circuit 37c includes four sets of a cascode circuit 38c, and each set includes two MOSFETs M31c, M32c that are cascode-connected. In other words, the output circuit 37c includes four cascode circuits 38c.

Each of the MOSFETs M31a to M32c is an N-channel type MOSFET. The respective gates of the MOSFETs M31a, M32a of the output circuit 37a are commonly connected. The commonly connected gates receive the turn-off drive signal IGOFF2[0] output from the pre-drive circuit 32. The respective gates of the MOSFETs M31b, M32b of the output circuit 37b are commonly connected. The commonly connected gates receive the turn-off drive signal IGOFF2[1] output from the pre-drive circuit 32. The respective gates of the MOSFETs M31c, M32c of the output circuit 37c are commonly connected. The commonly connected gates receive the turn-off drive signal IGOFF2[2] output from the pre-drive circuit 32.

The sources of the MOSFETs M31a, M31b, M31c are commonly connected, and are connected to the power supply line 27 supplied with the voltage Vc. The drains of the MOSFETs M31a, M31b, M31c are respectively connected to the sources of the MOSFETs M32a, M32b, M32c. The drains of the MOSFETs M32a, M32b, M32c are commonly connected, and are connected to the gate of the semiconductor switching element 7.

Therefore, the output circuit 37a includes one cascode circuit 38a, the output circuit 37b includes two cascode circuits 38a connected in parallel, and the output circuit 37c includes four cascode circuits 38c connected in parallel. The MOSFETs M31a to M32c included in the output circuits 37a to 37c are turned on and off according to the turn-off drive signal IGOFF2[2:0], as similar to the MOSFETs M1a to M2c included in the output circuits 16a to 16c according to the first embodiment.

According to the above structure, as similar to the structure according to the first embodiment, the gate current IG_off flows to turn off the semiconductor switching element 7, when at least one of the output circuits 37a to 37c is turned off. In this situation, by saturating the MOSFETs M31a to M32c, it is possible to operate the MOSFETs M31a to M32c with a constant power current supply so that the gate current Ig_off can be kept constant. In the above structure, it is possible to change the value of the gate current Ig_off according to the number of the output circuits 37a, 37b, 37c to be turned on.

The current capacity of each of the output circuits 37a to 37c is set to be proportional to 2 to the power of N, as similar to the output circuits 16a to 16c according to the first embodiment. In the present embodiment, the setting of the ratio of the current capacities of the respective output circuits 37a to 37c is described in the following. In this situation, the sizes of the MOSFETs M31a to M32c in the cascode circuits 38a to 38c are mutually different. However, each of the output circuits 37a to 37c has different number of cascode circuits.

In particular, the output circuit 37a includes one cascode circuit 38a; the output circuit 37b includes two cascode circuit 38b connected in parallel; and the output circuit 37c includes four cascode circuits 38c connected in parallel. In the present embodiment, the number of parallel connected circuit of the cascode circuit 38a is "1"; the number of parallel connected circuit of the cascode circuit 38b is "2"; and the number of the parallel connected cascode circuits 38c is "4". According to the above structure, as similar to the structure in the first embodiment, it is possible to change the value of the gate current Ig in eight ways.

(Layout Example of Pre-Drive Circuit and Drive Circuit)

Figure 21:
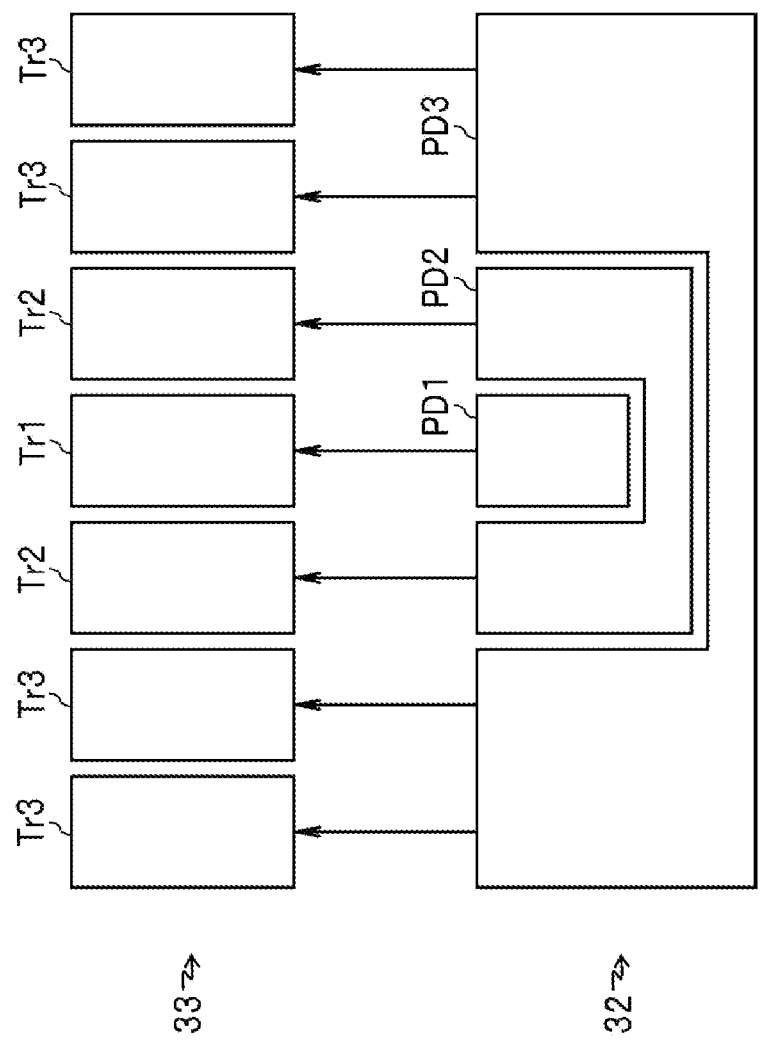
FIG. 21 schematically illustrates an example of a planar layout of a circuit element included in the gate driver according to the second embodiment.

For example, it is possible to adopt the arrangement illustrated in FIG. 21 for the planar layout of the circuit element in the pre-drive circuit 32 and the drive circuit 33. As illustrated in FIG. 21, a region Tr1, two regions Tr2, and four regions Tr3 are in a common centroid arrangement such that the center of mass is formed in one point. The MOSFETs M31a and M32a of the cascode circuit 38a are disposed in the region Tr1. The MOSFETs M31b, M32b of the cascode circuit 38b are disposed in each of two regions Tr2. The MOSFETs M31c, M32c of the cascode circuit 38c are disposed in each of four regions Tr3.

According to such an arrangement, it is possible to cancel variations in the gate current Ig caused by characteristic variations within a chip surface. It is also possible to suppress the generation of glitch caused by the characteristic variations in the input capacitances of MOSFETs M31a to M32c in the output circuits 37a to 37c.

A region PD1, a region PD2 and a region PD3 are included in the pre-drive circuit 32. In the region PD1, a circuit element corresponding to the output circuit 37a of the drive circuit 33 is disposed. In the region PD2, a circuit element corresponding to the output circuit 37b of the drive circuit 33 is disposed. In the region PD3, a circuit element corresponding to the output circuit 37c of the drive circuit 33 is disposed. The lengths of the respective wirings in the regions PD1, PD2, and PD3 are arranged to be in uniformity. Each of the respective wirings provides the drive signal from the pre-drive circuit 32 to the drive circuit 33. In FIG. 21, each wiring is schematically indicated by a simple arrow.

According to such an arrangement, the respective wiring lengths from the arithmetic circuit 11 to the corresponding MOSFETs M31a to M32c of the output circuits 37a to 37c can be made uniformly. In other words, it is possible to equalize the respective wiring lengths. As a result, the signal propagation delay caused by a capacitive component in the wiring can be equalized to suppress the generation of glitch.
(Operation Timing of Each Part During Switching)

Figure 22:
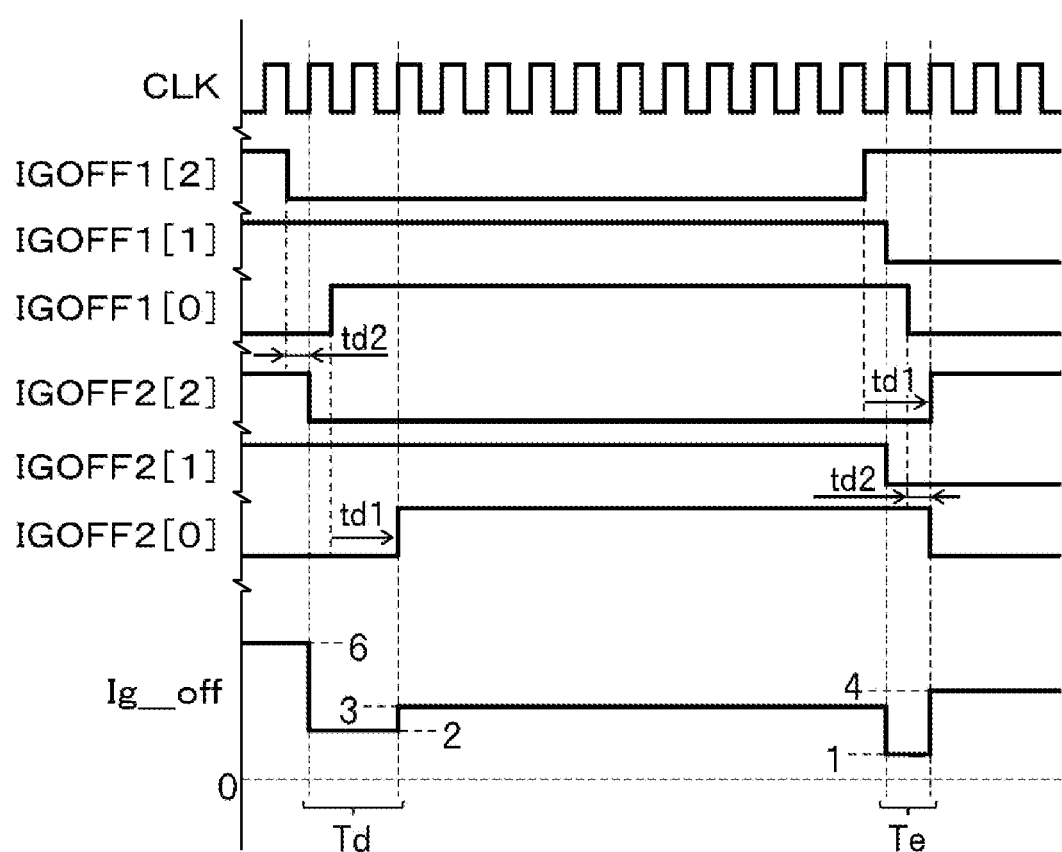
FIG. 22 is a timing chart for illustrating an operation timing of each part in the gate driver when a semiconductor switching element according to the second embodiment is turned off.

The following describes the operation timing of each part in the gate driver 31 during the switching of the semiconductor switching element 7 with reference to FIG. 22. In this situation, the arithmetic circuit 11 switches the command value of the gate current Ig_off indicated by the current command signal, in other words, the 3-bit turn-off command signal IGOFF1[2:0] in three levels such as "6", "3" and "4" in order.

Subsequently, the pre-drive circuit 32 receives the 3-bit turn-off drive signal IGOFF1[2:0]. However, there is a difference in the propagation time caused by, for example, the difference among the propagation path or the difference among the elements. In this situation, as similar to the first embodiment, with the operation of the glitch suppressor 34, the pre-drive circuit 32 outputs the 3-bit turn-off drive signal IGOFF2[2:0] as a signal acquired by setting the turn-on command edge to be later than the turn-off command edge by only a predetermined time. In FIG. 22, the first delay time provided to the turn-on command edge is expressed as a symbol td1, and the second delay time provided to the turn-off command edge is expressed as a symbol td2.

In this situation, as similar to the first embodiment, when the command value of the gate current Ig_off is switched, the periods Td, Te during which the gate current Ig_off is turned to a value deviated from the command value due to the influence of glitch are present. When the countermeasure of setting the turn-on command edge to be later than the turn-off command edge by a predetermined time through the glitch suppressor 34, the generation of glitch in which the gate current Ig_off becomes larger than the command value can be prevented.

As described above, with the gate driver 31 according to the present embodiment, it is possible to change the gate current Ig with higher precision and without enlarging the circuitry size while enhancing the responsiveness in the control of the gate current Ig, as similar to the first embodiment. According to the present embodiment, as similar to the first embodiment, it is possible to suppress the generation of glitch. In particular, it is possible to avoid the generation of glitch in which the gate current Ig_off becomes larger than the command value.

Third Embodiment

Hereinafter, a third embodiment in which a specific structure of the gate driver has been changed with respect to the first embodiment will be described with reference to FIGS. 23, 24.
(Functions of Gate Driver)

Figure 23:
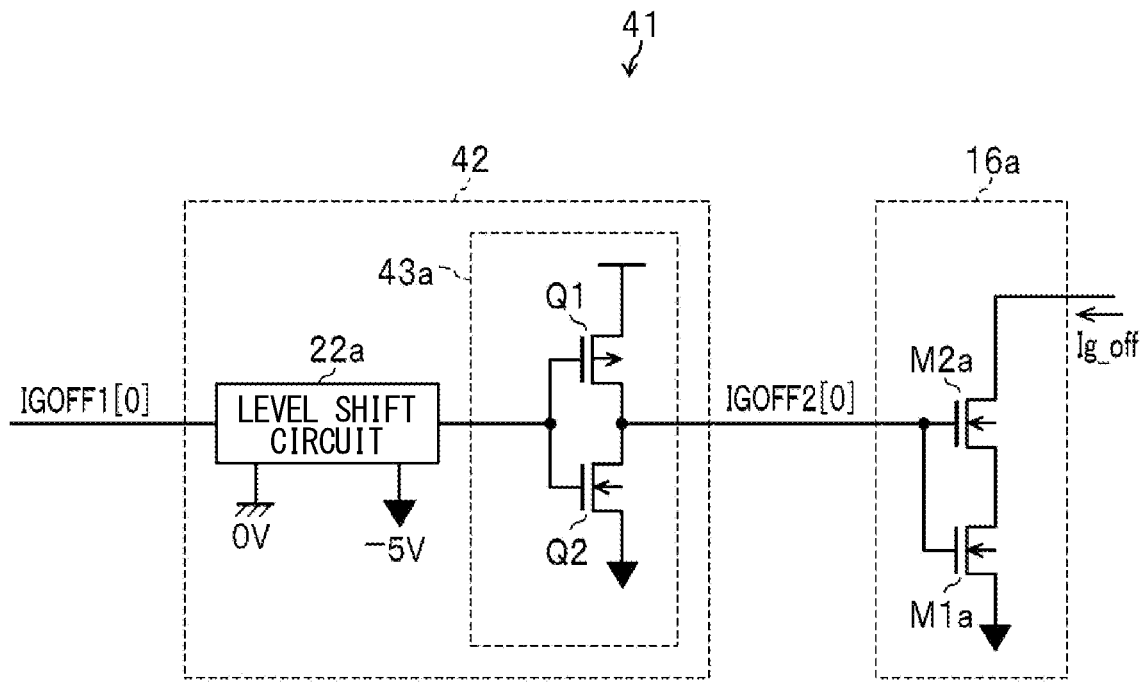
FIG. 23 illustrates an example of a structure of a gate driver according to a third embodiment.

As shown in FIG. 23, a gate driver 41 according to the present embodiment is different from the gate driver 4 according to the first embodiment in that a pre-drive circuit 42 is provided in place of the pre-drive circuit 14. FIG. 23 illustrates a portion of the structure of the gate driver 41 on the turn-off side. In particular, FIG. 23 illustrates only the output circuit 16a and the structure of the pre-drive circuit 42 corresponding to the output circuit 16a. However, other portions of the structure of the gate driver also have identical structures.

The pre-drive circuit 42 is different from the pre-drive circuit 14 such that the glitch suppression circuit 21a of the glitch suppressor 21 is omitted, and such that an output buffer 43a is provided in place of the output buffer 17a. In this situation, the level shift circuit 22a outputs a signal acquired by shifting the level of the turn-off command signal IGOFF1[0]. The output buffer 43a includes a push-pull output CMOS circuit. The CMOS circuit includes a transistor Q1 being a P-channel type MOSFET and a transistor Q2 being an N-channel type MOSFET. It is also possible to adopt a bipolar transistors as the transistors Q1, Q2 in the output buffer 43a. In other words, the output buffer 43a may include bipolar transistors.

The size of the transistor Q1 is smaller than the size of the transistor Q2. Thus, the pre-drive circuit 42 has a difference between its output sink capacity and output source capacity. In particular, the pre-drive circuit 42 has a relatively large output sink capacity, and has a relatively small source capacity.

Figure 24:
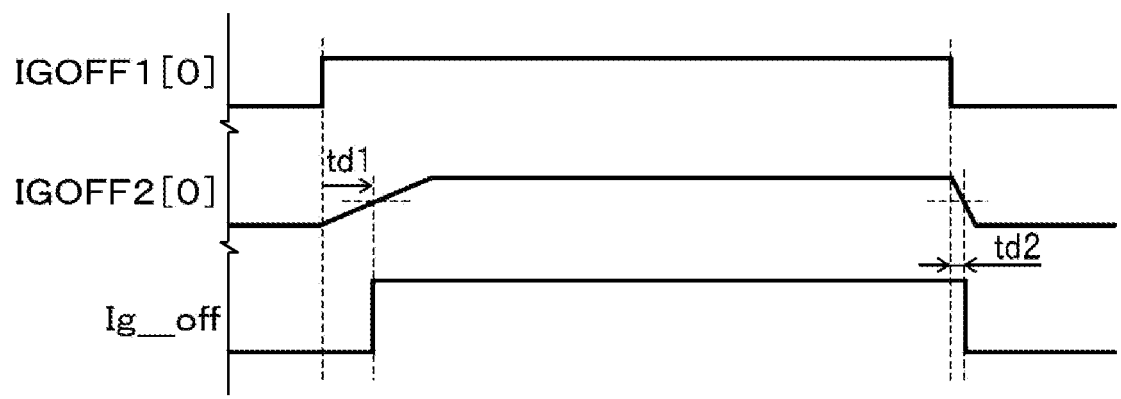
FIG. 24 is a timing chart for illustrating an operation timing of each part in the gate driver when the semiconductor switching element according to the third embodiment is turned off.

The operation timings of input/output signals of the pre-drive circuit 42 with the above structure are illustrated in FIG. 24. According to the above structure, the size of the transistor Q1 of the output buffer 43a is made relatively small. The delay time, in other words, the first delay time td1 from the turn-on command edge of the turn-off command signal IGOFF1[0] to a time at which the turn-off drive signal IGOFF2[0] rises to a level where the MOSFETs M1a, M2a can be turned on becomes longer.

According to the above structure, the size of the transistor Q2 of the output buffer 43a is made relatively large. The delay time, in other words, the second delay time td2 from the turn-off command edge of the turn-off command signal IGOFF1[0] to a time at which the turn-off drive signal IGOFF2[0] drops to a level where the MOSFETs M1a, M2a can be turned off becomes shorter.

As similar to the structure in the first embodiment, the pre-drive circuit 42 generates a drive signal and output the drive signal, such that a first delay time is longer than a second delay time. The first delay time is a time required for the MOSFETs M1a, M2a in the output circuit 16a to switch from an off-state to an on-state. The second delay time is a time required for the MOSFETs in the output circuit 16a to switch from the on-state to the off-state.

When such a pre-drive circuit 42 is applied to the structure on the turn-on side, the size of the transistor Q1 is made larger than the size of the transistor Q2. Therefore, the pre-drive circuit 42 has a relatively small output sink capacity, and has a relatively large source capacity. Even though the pre-drive circuit 42 is applied to the structure on the turn-on side, the pre-drive circuit 42 can generate a drive signal and output the drive signal, such that a first delay time is longer than a second delay time. The first delay time is a time required for the MOSFETs M1a, M2a in the output circuit 16a to switch from the off-state to the on-state. The second delay time is a time required for the MOSFETs M1a, M2a in the output circuit 16a to switch from the on-state to the off-state.

As described above, with the gate driver 41 according to the present embodiment, it is possible to change the gate current Ig with better precision and without enlarging the circuitry size while enhancing the responsiveness in the control of the gate current Ig, as similar to the first embodiment. According to the present embodiment, as similar to the first embodiment, it is possible to suppress the generation of glitch. In particular, it is possible to avoid the generation of glitch in which the gate current Ig_off becomes larger than the command value.

In the present embodiment, as in the first embodiment, it is possible to suppress the generation of glitch by providing a difference between the sink capacity and the source capacity in the output buffer 43a of the pre-drive circuit 42 without providing the glitch suppressor 21 as an addition circuit for providing a delay time for suppressing the glitch as in the first embodiment. Therefore, it is possible to reduce the circuitry size in the present embodiment as compared with the first embodiment.

Fourth Embodiment

Hereinafter, a fourth embodiment in which a specific structure of the gate driver has been changed with respect to the first embodiment will be described with reference to FIG. 25.

(Structure of Gate Driver)

Figure 25:
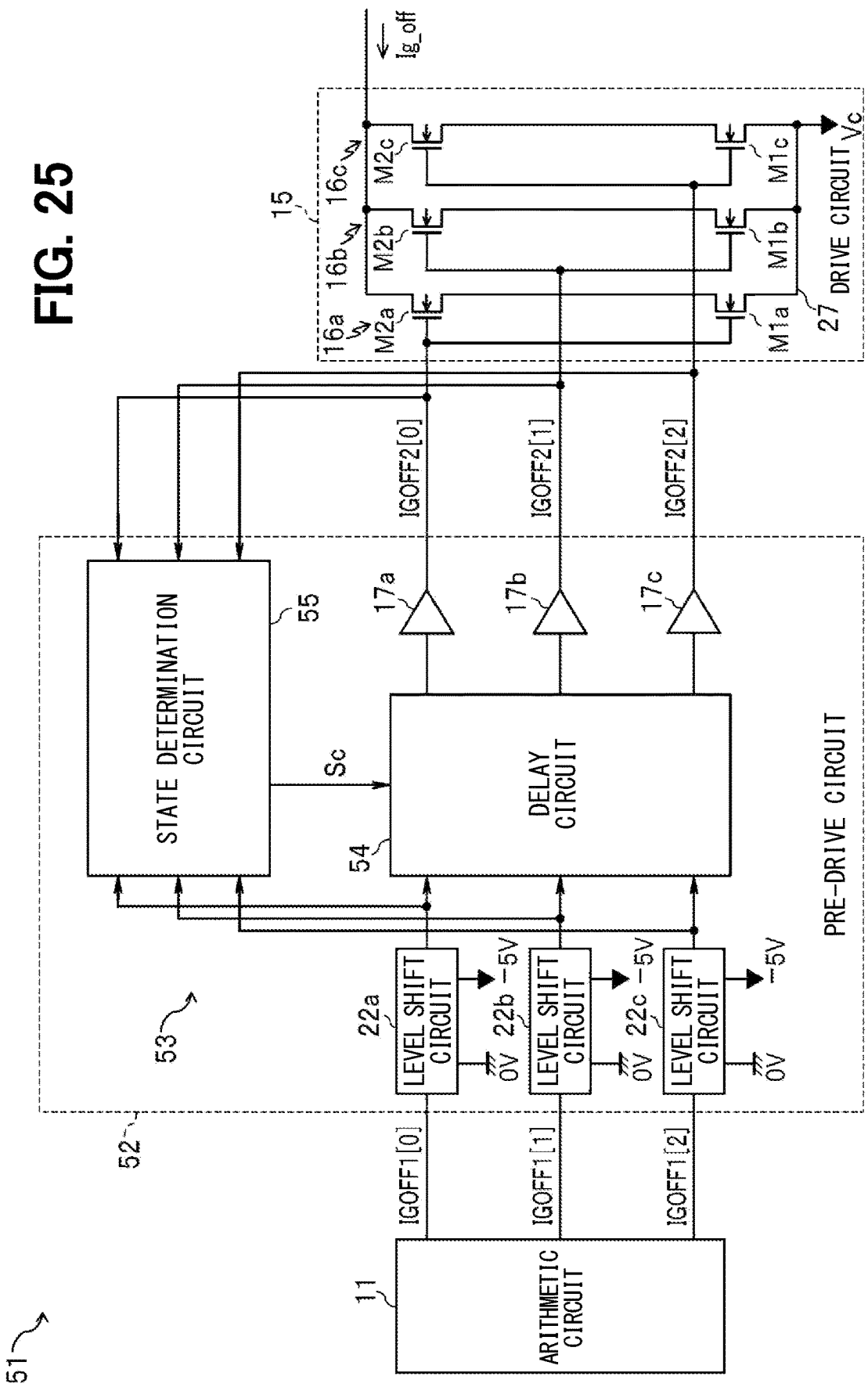
FIG. 25 illustrates an example of a structure of a gate driver according to a fourth embodiment.

As shown in FIG. 25, a gate driver 51 according to the present embodiment is different from the gate driver 4 according to the first embodiment in that a pre-drive circuit 52 is provided in place of the pre-drive circuit 14. Although FIG. 25 illustrates only the structure of the gate driver 51 on the turn-off side, the structure on the turn-on side may also adopt a structure identical to the structure on the turn-off side.

The pre-drive circuit 52 is different from the pre-drive circuit 14 such that a glitch suppressor 53 is provided in place of the glitch suppressor 21. In this situation, the level shift circuits 22a to 22c output signals acquired by shifting the levels of the turn-off command signals IGOFF1[2:0]. The glitch suppressor 53 includes a delay circuit 54 and a state determination circuit 55. The delay circuit 54 receives the respective output signals of the level shift circuits 22a to 22c.

The delay circuit 54 can delay only the turn-on command edge for signals acquired by shifting the levels of the input signals, in other words, turn-off command signals IGOFF1 [2:0]. The state determination circuit 55 provides a permission/prohibition signal Sc having a first level indicating the prohibition of the output of the turn-on command edge and a second level indicating permission of the output of the permission/prohibition signal Sc. When the permission/prohibition signal Sc indicates the first level, the delay circuit 54 delays the turn-on command edge so not to output the turn-on command edge until the first level is switched to the second level.

The state determination circuit 55 determines an on/off-state of each of the MOSFETs M1a to M2c in the output circuits 16a to 16c. The state determination circuit 55 includes a comparator (not shown) that compares each of the gates of the MOSFETs M1a to M2c with a predetermined threshold value. The predetermined threshold value is set to a value corresponding to the gate threshold voltage of each of the MOSFETs M1a to M2c. With the above structure, based on the output of the comparator, the state determination circuit 55 can detect that the gate voltage of each of the MOSFETs M1a to M2c drops to the threshold voltage or below the threshold voltage. In other words, the state determination circuit 55 can detect that the MOSFET M1a to M2c are switched to the off-state based on the output of the comparator.

The state determination circuit 55 receives the output signals of the level shift circuits 22a to 22c. The state determination circuit 55 can detect that a command of switching any one of the MOSFETs M1a to M2c in the output circuits 16a to 16c from the on-state to the off-state, based on the signal acquired by shifting each of the levels of the input signals, in other words, the turn-off command signals IGOFF1[2:0].

When the state determination circuit 55 detects that the command of switching any one of the MOSFETs M1a to M2c from the on-state to the off-state, the state determination circuit 55 outputs to the delay circuit 54 the permission/prohibition signal Sc at the level that indicates the prohibition of the output of the turn-on command edge. Subsequently, when the state determination circuit 55 detects that all of the MOSFETs being targets, to which the command of switching from the on-state to the off-state is provided, are turned off, the state determination circuit 55 outputs to the delay circuit 54 the permission/prohibition signal Sc at the level indicating the permission of the output of the turn-on command edge.

According to the above structure, after the pre-drive circuit 52 outputs a drive signal for switching a predetermined MOSFET among the MOSFETs M1a to M2c in the output circuits 16a to 16c from the on-state to the off-state, the pre-drive circuit 52 can output the drive signal for switching other MOSFETs from the off-state to the on-state after the state determination circuit 55 determines that the predetermined MOSFET is switched to the off-state.

As described above, with the gate driver 51 according to the present embodiment, it is possible to change the gate current Ig with better precision and without enlarging the circuitry size while enhancing the responsiveness in the control of the gate current Ig, as similar to the first embodiment. According to the present embodiment, as similar to the first embodiment, it is possible to suppress the generation of glitch. In particular, it is possible to avoid the generation of glitch in which the gate current Ig_off becomes larger than the command value.

Furthermore, according to the present embodiment, the following advantageous effect can be attained. In the structure according to each of the above embodiments, it is necessary to set the first delay time provided to the turn-on command edge to a relatively long time with a certain degree of margin in consideration of various variation factors. However, in the present embodiment, it is possible that the state determination circuit 55 directly monitors the on/off state of the MOSFETs M1a to M2c in the output circuits 16a to 16c. Therefore, it is possible to limit the first delay time provided to the turn-on command edge to a minimum required time, based on the monitoring result in the present embodiment. According to the present embodiment, it is possible to drive the MOSFETs M1a to M2c in the output circuits 16a to 16c with a relatively short delay time as compared to each of the above-mentioned embodiments. As a result, it is possible to further enhance the responsiveness of the control of the gate current Ig.

Other Embodiments

The present disclosure is not limited to the embodiments that have been described above and illustrated in the drawings, but can arbitrarily be modified, combined, or expanded without departing from the gist of the present disclosure. The numerical values and the like illustrated in each of the above embodiments are merely examples, and the present disclosure is not limited thereto.

The gate drive device in each embodiment described above can treat, as a drive subject, not only an N-channel MOSFET, but also various types of semiconductor switching element such as a P-channel MOSFET or an IGBT.

While the present disclosure has been described with reference to embodiments thereof, it is to be understood that the disclosure is not limited to the embodiments and constructions. The present disclosure encompasses various modifications and variations within the scope of equivalents. Furthermore, various combination and formation, and other combination and formation including one, more than one or less than one element may be made in the present disclosure.

What is claimed is:

1. A gate driver configured to drive a gate of a semiconductor switching element, the gate driver comprising:
a command signal output circuit configured to output a current command signal that indicates a command value of a gate current as a current flowing through the gate of the semiconductor switching element;
a pre-drive circuit configured to
receive the current command signal, and
generate a drive signal corresponding to the current command signal to output the drive signal; and
a drive circuit configured to drive the gate of the semiconductor switching element based on the drive signal, wherein
the command signal output circuit is further configured to switch the command value indicated by the current command signal to control a transient voltage at a desired target value,
the transient voltage corresponds to a voltage of a main terminal of the semiconductor switching element at a time of switching the semiconductor switching element,
the drive circuit includes a plurality of output circuits connected in parallel,
the plurality of output circuits have a plurality of MOSFETs and a plurality of cascode circuits,
each of the plurality of output circuits has one or more of the plurality of cascode circuits,
each of the plurality of cascode circuits has two of the plurality of MOSFETs that are cascode-connected,
the drive circuit is further configured to turn on at least one of the plurality of MOSFETs included in the plurality of output circuits to enable flow of the gate current to drive the gate of the semiconductor switching element, and
the drive circuit is further configured to change the gate current by changing number of the plurality of MOSFETs to be turned on by the drive circuit, according to the command value indicated by the drive signal.

2. The gate driver according to claim 1, wherein
the pre-drive circuit includes a plurality of output buffers respectively provided for the plurality of output circuits in the drive circuit,
the plurality of output circuits are respectively configured to have current capacities different from each other, and
the plurality of output buffers are respectively configured to have buffer capacities different from each other, according to the current capacities.

3. The gate driver according to claim 2, wherein each of the current capacities of the plurality of output circuits is set to be proportional to two to power of N, where N represents a natural number greater than or equal to zero.

4. The gate driver according to claim 2, wherein
each of the plurality of output circuits has one of the plurality of cascode circuits, and
the plurality of MOSFETs included in the plurality of cascode circuits are different in size.

5. The gate driver according to claim 2, wherein
the plurality of output circuits respectively have different number of the plurality of cascode circuits, and
the plurality of MOSFETs in the plurality of cascode circuits are identical in size.

6. The gate driver according to claim 1, wherein
the pre-drive circuit is further configured to generate and then output the drive signal to set a first delay time to be longer than a second delay time,
the first delay time is a time required for switching the plurality of MOSFETs from an off-state to an on-state, and
the second delay time is a time required for switching the plurality of MOSFETs from the on-state to the off-state.

7. The gate driver according to claim 6, wherein
the current command signal includes a plurality of command signals respectively provided to the plurality of output circuits,
each of the plurality of command signals is a binary signal having
a first level for commanding the plurality of MOSFETs in a corresponding one of the plurality of output circuits to be turned on, and
a second level for commanding the plurality of MOSFETs in the corresponding one of the plurality of output circuits to be turned off,
the pre-drive circuit is further configured to generate the drive signal by setting a turn-on command edge of each of the plurality of command signals to be later than a turn-off command edge of each of the plurality of command signals, and
the turn-on command edge is an edge at which the second level is switched to the first level, and the turn-off command edge is an edge at which the first level is switched to the second level.

8. The gate driver according to claim 6, wherein the pre-drive circuit is further configured to have a difference between an output sink capacity of the pre-drive circuit and a source capacity of the pre-drive circuit.

9. The gate driver according to claim 6, wherein
the pre-drive circuit includes a state determination circuit configured to determine an on/off state of each of the plurality of MOSFETs in the plurality of output circuits, and
the pre-drive circuit is further configured to output the drive signal for switching one or more of the plurality of MOSFETs from the on-state to the off-state, and then output the drive signal for switching other of the plurality of MOSFETs from the off-state to the on-state after the state determination circuit determines that the one or more of the plurality of MOSFETs is switched from the on-state to the off-state.

10. The gate driver according to claim 1, wherein respective gates of the two of the plurality of MOSFETs in each of the plurality of cascode circuits are commonly connected.

11. The gate driver according to claim 1, wherein
the two of the plurality of MOSFETs included in each of the plurality of cascode circuits are respectively a first transistor and a second transistor,
the first transistor is located on a common source side of each of the plurality of cascode circuits, and the second transistor is different from the first transistor located on the common source side,
a gate of the first transistor receives the drive signal, and
a gate of the second transistor receives a constant voltage identical to a power supply voltage for maintaining the first transistor in an on-state, such that the second transistor is operated constantly in the on-state.

12. The gate driver according to claim 1, wherein the two of the plurality of MOSFETs included in each of the plurality of cascode circuits are respectively a first transistor and a second transistor, the first transistor is located on a common source side of each of the plurality of cascode circuits, and the second transistor is different from the first transistor located on the common source side, a gate of the first transistor receives the drive signal, and a gate of the second transistor receives a constant voltage that is higher than a power supply voltage for maintaining the first transistor in an on-state and that is lower than a voltage acquired by subtracting a gate threshold voltage of the first transistor from a voltage being equal to twice of the power supply voltage, such that the second transistor is operated constantly in the on-state.

13. The gate driver according to claim 1, wherein the two of the plurality of MOSFETs included in each of the plurality of cascode circuits are respectively a first transistor and a second transistor, the first transistor is located on a common source side of each of the plurality of cascode circuits, and the second transistor is different from the first transistor located on the common source side, a gate of the first transistor receives the drive signal, a gate of the second transistor receives a constant voltage identical to a power supply voltage for maintaining the first transistor in an on-state, such that the second transistor is operated constantly in the on-state, each of the plurality of cascode circuits further includes a Zener diode connected between the gate and a source of the second transistor, and a Zener voltage of the Zener diode is lower than the power supply voltage.

14. The gate driver according to claim 1, the two of the plurality of MOSFETs included in each of the plurality of cascode circuits are respectively a first transistor and a second transistor, the first transistor is located on a common source side of each of the plurality of cascode circuits, and the second transistor is different from the first transistor located on the common source side, a gate of the first transistor receives the drive signal, a gate of the second transistor receives a signal acquired by shifting a level of the drive signal to a higher voltage, and the second transistor is switched between an on-state and an off-state at a timing identical to the first transistor.

* * * * *